(12) United States Patent
Kim et al.

(10) Patent No.: US 11,369,145 B2
(45) Date of Patent: Jun. 28, 2022

(54) AEROSOL GENERATING DEVICE INCLUDING DETACHABLE VAPORIZER

(71) Applicant: KT&G CORPORATION, Daejeon (KR)

(72) Inventors: Tae Hun Kim, Yongin-si (KR); Jong Sun Park, Suwon-si (KR)

(73) Assignee: KT&G CORPORATION, Daejeon (KR)

( * ) Notice: Subject to any disclaimer, the term of this patent is extended or adjusted under 35 U.S.C. 154(b) by 0 days.

(21) Appl. No.: 16/760,128

(22) PCT Filed: Oct. 26, 2018

(86) PCT No.: PCT/KR2018/012776
§ 371 (c)(1),
(2) Date: Apr. 29, 2020

(87) PCT Pub. No.: WO2019/088580
PCT Pub. Date: May 9, 2019

(65) Prior Publication Data
US 2020/0323264 A1 Oct. 15, 2020

(30) Foreign Application Priority Data

Oct. 30, 2017 (KR) .......................... 10-2017-0142578
Jun. 4, 2018 (KR) .......................... 10-2018-0064487

(51) Int. Cl.
*A24F 13/00* (2006.01)
*A24F 17/00* (2006.01)
(Continued)

(52) U.S. Cl.
CPC .......... *A24F 40/42* (2020.01); *A24B 15/167* (2016.11); *A24D 1/20* (2020.01); *A24D 3/17* (2020.01);
(Continued)

(58) Field of Classification Search
CPC .......... A24F 40/10; A24F 40/20; A24F 40/30; A24F 40/40; A24F 40/42
See application file for complete search history.

(56) References Cited

U.S. PATENT DOCUMENTS

| 5,348,027 A | 9/1994 | Barnes et al. |
| 5,388,594 A | 2/1995 | Counts et al. |

(Continued)

FOREIGN PATENT DOCUMENTS

| CA | 2 778 903 A1 | 5/2011 |
| CA | 2 970 045 A1 | 6/2016 |

(Continued)

OTHER PUBLICATIONS

Communication dated Feb. 24, 2021 by the Japanese Patent Office in application No. 2020-503962.

(Continued)

*Primary Examiner* — Abdullah A Riyami
*Assistant Examiner* — Thang H Nguyen
(74) *Attorney, Agent, or Firm* — Sughrue Mion, PLLC

(57) ABSTRACT

An exemplary embodiment of the present disclosure provides an aerosol-generating device including a case into which a cigarette is insertable, a vaporizer detachably combined with the case, and a detachment manipulation unit installed in the case and configured to perform, according to user manipulation, a first operation of maintaining a state in which the vaporizer is combined with the case and a second operation of allowing separation of the vaporizer from the case.

15 Claims, 17 Drawing Sheets

(51) Int. Cl.

| | | |
|---|---|---|
| A24F 25/00 | (2006.01) | |
| A24F 40/42 | (2020.01) | |
| A24F 40/90 | (2020.01) | |
| A24F 40/46 | (2020.01) | |
| A24B 15/167 | (2020.01) | |
| A24F 40/20 | (2020.01) | |
| A24F 40/30 | (2020.01) | |
| A24D 3/17 | (2020.01) | |
| A24D 1/20 | (2020.01) | |
| A24F 40/60 | (2020.01) | |
| F21V 3/00 | (2015.01) | |
| F21V 5/00 | (2018.01) | |
| G02B 19/00 | (2006.01) | |
| H05B 3/54 | (2006.01) | |
| A24F 40/485 | (2020.01) | |
| A24F 40/10 | (2020.01) | |
| A24F 40/44 | (2020.01) | |
| A24F 40/40 | (2020.01) | |
| A24F 40/57 | (2020.01) | |
| A24F 40/65 | (2020.01) | |
| H05K 1/02 | (2006.01) | |
| H05K 1/14 | (2006.01) | |
| H05K 1/18 | (2006.01) | |
| A24F 40/50 | (2020.01) | |
| A24F 40/95 | (2020.01) | |
| A24F 15/01 | (2020.01) | |
| A24F 40/51 | (2020.01) | |
| F21Y 115/10 | (2016.01) | |

(52) U.S. Cl.
CPC ............ *A24F 15/01* (2020.01); *A24F 40/10* (2020.01); *A24F 40/20* (2020.01); *A24F 40/30* (2020.01); *A24F 40/40* (2020.01); *A24F 40/44* (2020.01); *A24F 40/46* (2020.01); *A24F 40/485* (2020.01); *A24F 40/50* (2020.01); *A24F 40/57* (2020.01); *A24F 40/60* (2020.01); *A24F 40/65* (2020.01); *A24F 40/90* (2020.01); *A24F 40/95* (2020.01); *F21V 3/00* (2013.01); *F21V 5/00* (2013.01); *G02B 19/0009* (2013.01); *G02B 19/0061* (2013.01); *H05B 3/54* (2013.01); *H05K 1/0203* (2013.01); *H05K 1/0277* (2013.01); *H05K 1/148* (2013.01); *H05K 1/181* (2013.01); *A24F 40/51* (2020.01); *F21Y 2115/10* (2016.08); *H05K 2201/012* (2013.01); *H05K 2201/0154* (2013.01); *H05K 2201/10219* (2013.01)

(56) References Cited

U.S. PATENT DOCUMENTS

| | | | |
|---|---|---|---|
| 5,408,574 A | 4/1995 | Deevi et al. | |
| 5,505,214 A | 4/1996 | Collins et al. | |
| 5,555,476 A | 9/1996 | Suzuki et al. | |
| 5,665,262 A | 9/1997 | Hajaligol et al. | |
| 5,692,525 A | 12/1997 | Counts et al. | |
| 5,723,228 A | 3/1998 | Okamoto | |
| 5,750,964 A | 5/1998 | Counts et al. | |
| 5,848,596 A * | 12/1998 | Zelenik | A24F 23/04 131/329 |
| 5,878,752 A | 3/1999 | Adams et al. | |
| 5,902,501 A | 5/1999 | Nunnally et al. | |
| 5,949,346 A | 9/1999 | Suzuki et al. | |
| 6,026,820 A | 2/2000 | Baggett, Jr. et al. | |
| 6,615,840 B1 | 9/2003 | Fournier et al. | |
| 6,803,550 B2 | 10/2004 | Sharpe et al. | |
| 6,810,883 B2 | 11/2004 | Felter et al. | |
| 7,082,825 B2 | 8/2006 | Aoshima et al. | |
| 7,594,945 B2 | 9/2009 | Kim et al. | |
| 7,682,571 B2 | 3/2010 | Kim et al. | |
| 7,726,320 B2 | 6/2010 | Robinson et al. | |
| 8,205,622 B2 | 6/2012 | Pan | |
| 8,558,147 B2 | 10/2013 | Greim et al. | |
| 8,602,037 B2 | 12/2013 | Inagaki | |
| 8,689,804 B2 | 4/2014 | Fernando et al. | |
| 8,833,364 B2 | 9/2014 | Buchberger | |
| 8,997,754 B2 | 4/2015 | Tucker et al. | |
| 9,084,440 B2 | 7/2015 | Zuber et al. | |
| 9,165,484 B2 | 10/2015 | Choi | |
| 9,295,286 B2 | 3/2016 | Shin | |
| 9,347,644 B2 | 5/2016 | Araki et al. | |
| 9,405,148 B2 | 8/2016 | Chang et al. | |
| 9,420,829 B2 | 8/2016 | Thorens et al. | |
| 9,516,899 B2 * | 12/2016 | Plojoux | A24F 40/50 |
| 9,532,600 B2 | 1/2017 | Thorens et al. | |
| 9,541,820 B2 | 1/2017 | Ogawa | |
| 9,693,587 B2 | 7/2017 | Plojoux et al. | |
| 9,713,345 B2 | 7/2017 | Farine et al. | |
| 9,833,021 B2 * | 12/2017 | Perez | A24F 40/42 |
| 9,839,238 B2 | 12/2017 | Worm et al. | |
| 9,844,234 B2 | 12/2017 | Thorens et al. | |
| 9,848,651 B2 | 12/2017 | Wu | |
| 9,854,845 B2 | 1/2018 | Plojoux et al. | |
| 9,918,498 B2 | 3/2018 | Liu | |
| 9,949,507 B2 | 4/2018 | Flick | |
| 9,974,117 B2 | 5/2018 | Qiu | |
| 10,070,667 B2 | 9/2018 | Lord et al. | |
| 10,104,909 B2 | 10/2018 | Han et al. | |
| 10,104,911 B2 | 10/2018 | Thorens et al. | |
| 10,136,673 B2 | 11/2018 | Mironov | |
| 10,136,675 B2 | 11/2018 | Li et al. | |
| 10,143,232 B2 | 12/2018 | Talon | |
| 10,238,149 B2 | 3/2019 | Hon | |
| 10,258,081 B1 * | 4/2019 | Goradesky | A24F 13/22 |
| 10,343,818 B2 * | 7/2019 | Murphy | B65D 43/16 |
| 10,390,564 B2 | 8/2019 | Fernando et al. | |
| 10,412,994 B2 | 9/2019 | Schennum et al. | |
| 10,420,903 B2 | 9/2019 | Chen et al. | |
| 10,426,193 B2 | 10/2019 | Schennum et al. | |
| 10,548,350 B2 | 2/2020 | Greim et al. | |
| 10,555,555 B2 | 2/2020 | Fernando et al. | |
| 10,602,778 B2 | 3/2020 | Hu et al. | |
| 10,617,149 B2 | 4/2020 | Malgat et al. | |
| 10,694,783 B2 | 6/2020 | Jochnowitz | |
| 10,701,973 B2 | 7/2020 | Lee | |
| 10,842,194 B2 | 11/2020 | Batista et al. | |
| 10,945,462 B2 * | 3/2021 | Davis | A24F 40/90 |
| 10,973,087 B2 | 4/2021 | Wang et al. | |
| 11,051,545 B2 | 7/2021 | Batista et al. | |
| 11,051,550 B2 | 7/2021 | Lin et al. | |
| 11,147,316 B2 | 10/2021 | Farine et al. | |
| 2003/0226837 A1 | 12/2003 | Blake et al. | |
| 2004/0089314 A1 | 5/2004 | Felter et al. | |
| 2004/0149737 A1 | 8/2004 | Sharpe et al. | |
| 2005/0142036 A1 | 6/2005 | Kim et al. | |
| 2006/0267614 A1 | 11/2006 | Lee et al. | |
| 2007/0007266 A1 | 1/2007 | Sasaki et al. | |
| 2007/0074734 A1 | 4/2007 | Braunshteyn et al. | |
| 2007/0246382 A1 | 10/2007 | He | |
| 2007/0267031 A1 | 11/2007 | Hon | |
| 2010/0313901 A1 * | 12/2010 | Fernando | A24F 40/95 131/330 |
| 2011/0226236 A1 * | 9/2011 | Buchberger | A61K 31/465 128/200.23 |
| 2011/0234069 A1 | 9/2011 | Chen et al. | |
| 2013/0014772 A1 | 1/2013 | Liu | |
| 2013/0228191 A1 | 9/2013 | Newton | |
| 2013/0255675 A1 | 10/2013 | Liu | |
| 2014/0060554 A1 | 3/2014 | Collett et al. | |
| 2014/0069424 A1 | 3/2014 | Poston et al. | |
| 2014/0209105 A1 | 7/2014 | Sears et al. | |
| 2014/0217085 A1 * | 8/2014 | Alima | F23Q 7/16 219/474 |
| 2014/0261487 A1 | 9/2014 | Chapman et al. | |
| 2014/0286630 A1 | 9/2014 | Buchberger | |
| 2014/0339509 A1 | 11/2014 | Choi et al. | |
| 2014/0345633 A1 | 11/2014 | Talon et al. | |
| 2014/0353856 A1 | 12/2014 | Dubief | |

(56) References Cited

U.S. PATENT DOCUMENTS

| | | | |
|---|---|---|---|
| 2015/0020831 A1 | 1/2015 | Weigensberg et al. | |
| 2015/0114411 A1* | 4/2015 | Buchberger | A61M 11/041 131/329 |
| 2015/0223520 A1 | 8/2015 | Phillips et al. | |
| 2015/0230521 A1 | 8/2015 | Talon | |
| 2015/0282527 A1 | 10/2015 | Henry, Jr. | |
| 2015/0327596 A1 | 11/2015 | Alarcon et al. | |
| 2016/0103364 A1 | 4/2016 | Nam et al. | |
| 2016/0120218 A1* | 5/2016 | Schennum | A24F 15/20 206/266 |
| 2016/0128386 A1 | 5/2016 | Chen | |
| 2016/0174613 A1 | 6/2016 | Zuber et al. | |
| 2016/0205998 A1 | 7/2016 | Matsumoto et al. | |
| 2016/0321879 A1 | 11/2016 | Oh et al. | |
| 2016/0324216 A1 | 11/2016 | Li et al. | |
| 2016/0331030 A1 | 11/2016 | Ampolini et al. | |
| 2016/0345625 A1 | 12/2016 | Liu | |
| 2016/0366946 A1* | 12/2016 | Murison | B67D 7/02 |
| 2017/0020195 A1 | 1/2017 | Cameron | |
| 2017/0035105 A1* | 2/2017 | Jordan | A24F 7/04 |
| 2017/0042227 A1 | 2/2017 | Gavrielov et al. | |
| 2017/0055589 A1 | 3/2017 | Fernando et al. | |
| 2017/0119051 A1 | 5/2017 | Blandino et al. | |
| 2017/0119053 A1 | 5/2017 | Henry, Jr. et al. | |
| 2017/0143041 A1 | 5/2017 | Batista et al. | |
| 2017/0188634 A1 | 7/2017 | Plojoux et al. | |
| 2017/0197043 A1 | 7/2017 | Buchberger | |
| 2017/0197046 A1 | 7/2017 | Buchberger | |
| 2017/0214261 A1 | 7/2017 | Gratton | |
| 2017/0238609 A1 | 8/2017 | Schlipf | |
| 2017/0295844 A1 | 10/2017 | Thevenaz et al. | |
| 2017/0325505 A1 | 11/2017 | Force et al. | |
| 2017/0347715 A1 | 12/2017 | Mironov et al. | |
| 2018/0027878 A1 | 2/2018 | Dendy et al. | |
| 2018/0028993 A1 | 2/2018 | Dubief | |
| 2018/0160733 A1 | 6/2018 | Leadley et al. | |
| 2018/0199630 A1 | 7/2018 | Qiu | |
| 2019/0059448 A1 | 2/2019 | Talon | |
| 2019/0159524 A1 | 5/2019 | Qiu | |
| 2019/0281896 A1 | 9/2019 | Chapman et al. | |
| 2020/0086069 A1 | 3/2020 | Riebe et al. | |
| 2020/0093177 A1 | 3/2020 | Han et al. | |
| 2020/0093185 A1 | 3/2020 | Lim | |
| 2020/0094997 A1 | 3/2020 | Menon et al. | |
| 2020/0154765 A1 | 5/2020 | Lee et al. | |
| 2020/0196670 A1 | 6/2020 | Alarcon et al. | |
| 2020/0260790 A1 | 8/2020 | Kaufman et al. | |
| 2020/0305240 A1 | 9/2020 | Holoubek et al. | |
| 2020/0329772 A1 | 10/2020 | Kim et al. | |
| 2020/0352253 A1* | 11/2020 | Holzherr | A24F 40/90 |
| 2020/0359681 A1* | 11/2020 | Han | A24F 40/40 |
| 2020/0404969 A1 | 12/2020 | Zuber et al. | |

FOREIGN PATENT DOCUMENTS

| | | |
|---|---|---|
| CN | 1078621 A | 11/1993 |
| CN | 1126425 A | 7/1996 |
| CN | 1190335 A | 8/1998 |
| CN | 1280661 A | 1/2001 |
| CN | 1491598 A | 4/2004 |
| CN | 1633247 A | 6/2005 |
| CN | 1871987 A | 12/2006 |
| CN | 101277622 A | 10/2008 |
| CN | 101324490 A | 12/2008 |
| CN | 101518361 A | 9/2009 |
| CN | 101557728 A | 10/2009 |
| CN | 101637308 A | 2/2010 |
| CN | 201657047 U | 11/2010 |
| CN | 102264251 A | 11/2011 |
| CN | 102595943 A | 7/2012 |
| CN | 202385727 U | 8/2012 |
| CN | 102665459 A | 9/2012 |
| CN | 103099319 A | 5/2013 |
| CN | 202907797 U | 5/2013 |
| CN | 203040065 U | 7/2013 |
| CN | 103271447 A | 9/2013 |
| CN | 103477252 A | 12/2013 |
| CN | 103519351 A | 1/2014 |
| CN | 103653257 A | 3/2014 |
| CN | 103653258 A | 3/2014 |
| CN | 203492793 U | 3/2014 |
| CN | 103889258 A | 6/2014 |
| CN | 103974635 A | 8/2014 |
| CN | 103974638 A | 8/2014 |
| CN | 103974640 A | 8/2014 |
| CN | 103997922 A | 8/2014 |
| CN | 104146353 A | 11/2014 |
| CN | 104188110 A | 12/2014 |
| CN | 104219973 A | 12/2014 |
| CN | 204120226 U | 1/2015 |
| CN | 204146340 U | 2/2015 |
| CN | 104423130 A | 3/2015 |
| CN | 204393344 U | 6/2015 |
| CN | 104886776 A | 9/2015 |
| CN | 105188430 A | 12/2015 |
| CN | 204838003 U | 12/2015 |
| CN | 105326092 A | 2/2016 |
| CN | 205072064 U | 3/2016 |
| CN | 205180371 U | 4/2016 |
| CN | 105722416 A | 6/2016 |
| CN | 205358225 U | 7/2016 |
| CN | 105852221 A | 8/2016 |
| CN | 205456064 U | 8/2016 |
| CN | 205624474 U | 10/2016 |
| CN | 106136331 A | 11/2016 |
| CN | 106163304 A | 11/2016 |
| CN | 106170215 A | 11/2016 |
| CN | 205671480 U | 11/2016 |
| CN | 106231934 A | 12/2016 |
| CN | 106235419 A | 12/2016 |
| CN | 205831079 U | 12/2016 |
| CN | 106418729 A | 2/2017 |
| CN | 106473232 A | 3/2017 |
| CN | 106473233 A | 3/2017 |
| CN | 106490686 A | 3/2017 |
| CN | 106723379 A | 5/2017 |
| CN | 106793834 A | 5/2017 |
| CN | 206314585 U | 7/2017 |
| CN | 106998816 A | 8/2017 |
| CN | 107105772 A | 8/2017 |
| CN | 206442590 U | 8/2017 |
| CN | 206443214 U | 8/2017 |
| CN | 107183789 A | 9/2017 |
| CN | 206462413 U | 9/2017 |
| CN | 107249366 A | 10/2017 |
| CN | 107278125 A | 10/2017 |
| CN | 206547882 U | 10/2017 |
| CN | 107801375 A | 3/2018 |
| CN | 108013512 A | 5/2018 |
| CN | 110325058 A | 10/2019 |
| CN | 110958841 A | 4/2020 |
| EA | 201290392 A1 | 10/2012 |
| EA | 201290240 A1 | 12/2012 |
| EA | 026076 B1 | 2/2017 |
| EP | 0 438 862 A2 | 7/1991 |
| EP | 0 917 831 A1 | 5/1999 |
| EP | 0 822 760 B1 | 6/2003 |
| EP | 1 947 965 A2 | 7/2008 |
| EP | 2 201 850 A1 | 6/2010 |
| EP | 2 316 286 A1 | 5/2011 |
| EP | 2 327 318 A1 | 6/2011 |
| EP | 2 340 729 A1 | 7/2011 |
| EP | 2368449 A1 | 9/2011 |
| EP | 2 677 273 A1 | 12/2013 |
| EP | 2 921 065 A1 | 9/2015 |
| EP | 3 257 386 B1 | 6/2019 |
| EP | 3 248 486 B1 | 8/2019 |
| EP | 3 569 076 A1 | 11/2019 |
| EP | 3 248 485 B1 | 4/2020 |
| EP | 3 656 229 A2 | 5/2020 |
| GB | 2 301 894 A | 12/1996 |
| GB | 2514893 A | 12/2014 |
| JP | 62-15793 A | 1/1987 |

(56) References Cited

FOREIGN PATENT DOCUMENTS

| | | |
|---|---|---|
| JP | 6-73784 U | 10/1994 |
| JP | 7-72809 A | 3/1995 |
| JP | 7-184627 A | 7/1995 |
| JP | 9-75058 A | 3/1997 |
| JP | 9-161822 A | 6/1997 |
| JP | 9-228919 A | 9/1997 |
| JP | 10-37781 A | 2/1998 |
| JP | 2003-527127 A | 9/2003 |
| JP | 2004-212102 A | 7/2004 |
| JP | 2005-199913 A | 7/2005 |
| JP | 2006-292620 A | 10/2006 |
| JP | 3898118 B2 | 3/2007 |
| JP | 2007-101639 A | 4/2007 |
| JP | 2010-266425 A | 11/2010 |
| JP | 2013-509160 A | 3/2013 |
| JP | 2013-524835 A | 6/2013 |
| JP | 2014-216287 A | 11/2014 |
| JP | 2014-533513 A | 12/2014 |
| JP | 2015-13192 A | 1/2015 |
| JP | 2015-503916 A | 2/2015 |
| JP | 2015-504669 A | 2/2015 |
| JP | 2015-506170 A | 3/2015 |
| JP | 2015-528307 A | 9/2015 |
| JP | 2016-512033 A | 4/2016 |
| JP | 2016-521552 A | 7/2016 |
| JP | 2017-506901 A | 3/2017 |
| JP | 2017-510270 A | 4/2017 |
| JP | 2017-511123 A | 4/2017 |
| JP | 2017-522876 A | 8/2017 |
| JP | 2018-504962 A | 2/2018 |
| KR | 1999-0081973 A | 11/1999 |
| KR | 20-0203233 Y1 | 11/2000 |
| KR | 10-0304044 B1 | 11/2001 |
| KR | 10-2004-0084899 A | 10/2004 |
| KR | 10-2005-0065896 A | 6/2005 |
| KR | 10-0495099 B1 | 11/2005 |
| KR | 10-2006-0121638 A | 11/2006 |
| KR | 10-0782063 B1 | 12/2007 |
| KR | 10-1012472 B1 | 2/2011 |
| KR | 10-2011-0096548 A | 8/2011 |
| KR | 10-1062248 B1 | 9/2011 |
| KR | 20-2011-0008931 U | 9/2011 |
| KR | 10-2012-0027029 A | 3/2012 |
| KR | 10-2012-0050568 A | 5/2012 |
| KR | 20-0460461 Y1 | 5/2012 |
| KR | 10-1174189 B1 | 8/2012 |
| KR | 10-2012-0101637 A | 9/2012 |
| KR | 10-2012-0102131 A | 9/2012 |
| KR | 10-2012-0104533 A | 9/2012 |
| KR | 10-2012-0115488 A | 10/2012 |
| KR | 20-2012-0007263 U | 10/2012 |
| KR | 20-2012-0008751 U | 12/2012 |
| KR | 10-2013-0031025 A | 3/2013 |
| KR | 10-1239080 B1 | 3/2013 |
| KR | 10-2013-0084789 A | 7/2013 |
| KR | 10-2013-0139276 A | 12/2013 |
| KR | 10-2013-0139298 A | 12/2013 |
| KR | 10-1338073 B1 | 12/2013 |
| KR | 10-2014-0116055 A | 10/2014 |
| KR | 10-2014-0116381 A | 10/2014 |
| KR | 10-2014-0118980 A | 10/2014 |
| KR | 10-2014-0119029 A | 10/2014 |
| KR | 10-2014-0135568 A | 11/2014 |
| KR | 10-1464801 B1 | 11/2014 |
| KR | 10-1465846 B1 | 11/2014 |
| KR | 10-1480423 B1 | 1/2015 |
| KR | 10-1486294 B1 | 1/2015 |
| KR | 10-2015-0111021 A | 10/2015 |
| KR | 10-2016-0005323 A | 1/2016 |
| KR | 10-2016-0012154 A | 2/2016 |
| KR | 10-2016-0031801 A | 3/2016 |
| KR | 10-2016-0052607 A | 5/2016 |
| KR | 10-1631286 B1 | 6/2016 |
| KR | 10-1635340 B1 | 6/2016 |
| KR | 10-2016-0082570 A | 7/2016 |
| KR | 10-2016-0086118 A | 7/2016 |
| KR | 10-2016-0088163 A | 7/2016 |
| KR | 10-1660214 B1 | 9/2016 |
| KR | 10-2016-0129024 A | 11/2016 |
| KR | 10-1677547 B1 | 11/2016 |
| KR | 10-1679163 B1 | 11/2016 |
| KR | 10-2017-0006282 A | 1/2017 |
| KR | 10-2017-0020807 A | 2/2017 |
| KR | 10-2017-0049699 A | 5/2017 |
| KR | 10-1733448 B1 | 5/2017 |
| KR | 10-2017-0067171 A | 6/2017 |
| KR | 10-2017-0083596 A | 7/2017 |
| KR | 10-2017-0117444 A | 10/2017 |
| KR | 10-2017-0118233 A | 10/2017 |
| KR | 10-2018-0032592 A | 3/2018 |
| KR | 10-2018-0125852 A | 11/2018 |
| KR | 10-2018-0129637 A | 12/2018 |
| KR | 10-2019-0016907 A | 2/2019 |
| RU | 2 132 629 C1 | 7/1999 |
| RU | 2551944 C1 | 6/2015 |
| RU | 2611487 C2 | 2/2017 |
| RU | 2617297 C2 | 4/2017 |
| RU | 2 619 735 C1 | 5/2017 |
| RU | 2015152134 A | 6/2017 |
| WO | 95/27412 A1 | 10/1995 |
| WO | 98/23171 A1 | 6/1998 |
| WO | 2007039794 A2 | 4/2007 |
| WO | 2009/041451 A1 | 4/2009 |
| WO | 2009/044716 A1 | 4/2009 |
| WO | 2010073122 A1 | 7/2010 |
| WO | 2011/015826 A1 | 2/2011 |
| WO | 2011/050964 A1 | 5/2011 |
| WO | 2011/063970 A1 | 6/2011 |
| WO | 2013/102609 A2 | 7/2013 |
| WO | 2014/195679 A2 | 12/2014 |
| WO | 2015/035510 A1 | 3/2015 |
| WO | 2015/070402 A1 | 5/2015 |
| WO | 2015/082560 A1 | 6/2015 |
| WO | 2015/128665 A1 | 9/2015 |
| WO | 2015/174657 A1 | 11/2015 |
| WO | 2015/177046 A1 | 11/2015 |
| WO | 2015/189388 A1 | 12/2015 |
| WO | 2016/009202 A1 | 1/2016 |
| WO | 2016/012795 A1 | 1/2016 |
| WO | 2016/096337 A1 | 6/2016 |
| WO | 2016/111633 A1 | 7/2016 |
| WO | 2016/123738 A1 | 8/2016 |
| WO | 2016/127541 A1 | 8/2016 |
| WO | 2016120177 A1 | 8/2016 |
| WO | 2016/138689 A1 | 9/2016 |
| WO | 2016/199065 A1 | 12/2016 |
| WO | 2016/199066 A1 | 12/2016 |
| WO | 2016/207407 A1 | 12/2016 |
| WO | 2017/001818 A1 | 1/2017 |
| WO | 2017/005471 A1 | 1/2017 |
| WO | 2017/029089 A1 | 2/2017 |
| WO | 2017/077466 A1 | 5/2017 |
| WO | 2017/133056 A1 | 8/2017 |
| WO | 2017/163046 A1 | 9/2017 |
| WO | 2017/182485 A1 | 10/2017 |
| WO | 2017/211600 A1 | 12/2017 |
| WO | 2018/190606 A1 | 10/2018 |
| WO | 2018/191766 A1 | 10/2018 |
| WO | 2019/015343 A1 | 1/2019 |

OTHER PUBLICATIONS

Communication dated Mar. 23, 2021 by the Japanese Patent Office in application No. 2020-522897.
Communication dated Mar. 2, 2021 by the Japanese Patent Office in application No. 2020-523669.
Communication dated Mar. 30, 2021 by the Japanese Patent Office in application No. 2020-501446.
Communication dated Mar. 16, 2021 by the Japanese Patent Office in application No. 2020-521441.
Communication dated Feb. 9, 2021 by the Japanese Patent Office in application No. 2020-501205.

(56) References Cited

OTHER PUBLICATIONS

Communication dated Mar. 16, 2021 by the European Patent Office in application No. 18806877.9.
Office Action dated Aug. 12, 2019 in Korean Application No. 10-2019-0033722.
Office Action dated Jul. 2, 2019 in Korean Application No. 10-2019-0017392.
Office Action dated Jul. 3, 2019 in Korean Application No. 10-2019-0016835.
Office Action dated May 18, 2019 in Korean Application No. 10-2018-0090063.
Office Action dated Oct. 25, 2019 in Korean Application No. 10-2018-0078296.
Office Action dated Oct. 15, 2019 in Korean Application No. 10-2018-0074188.
Office Action dated Oct. 8, 2019 in Korean Application No. 10-2018-0072992.
Office Action dated Oct. 8, 2019 in Korean Application No. 10-2018-0072935.
Office Action dated Sep. 6, 2019 in Korean Application No. 10-2018-0069645.
Office Action dated Jul. 10, 2019 in Korean Application No. 10-2018-0064487.
Office Action dated Jun. 24, 2019 in Korean Application No. 10-2018-0062137.
Office Action dated Jun. 19, 2019 in Korean Application No. 10-2018-0059580.
Office Action dated May 13, 2019 in Korean Application No. 10-2018-0058596.
Office Action dated May 3, 2019 in Korean Application No. 10-2018-0055120.
Office Action dated Dec. 9, 2019 in Korean Application No. 10-2018-0052133.
Office Action dated Dec. 9, 2019 in Korean Application No. 10-2018-0051469.
Office Action dated Dec. 9, 2019 in Korean Application No. 10-2018-0051467.
International Search Report dated Apr. 16, 2019 in International Application No. PCT/KR2018/012899.
International Search Report dated Apr. 26, 2019 in International Application No. PCT/KR2018/012895.
International Search Report dated May 17, 2019 in International Application No. PCT/KR2018/012810.
International Search Report dated May 17, 2019 in International Application No. PCT/KR2018/012809.
International Search Report dated May 17, 2019 in International Application No. PCT/KR2018/012808.
International Search Report dated May 3, 2019 in International Application No. PCT/KR2018/012807.
International Search Report dated May 17, 2019 in International Application No. PCT/KR2018/012776.
International Search Report dated Apr. 3, 2019 in International Application No. PCT/KR2018/012775.
International Search Report dated Apr. 3, 2019 in International Application No. PCT/KR2018/012774.
International Search Report dated Apr. 3, 2019 in International Application No. PCT/KR2018/012773.
International Search Report dated May 20, 2019 in International Application No. PCT/KR2018/012685.
International Search Report dated May 21, 2019 in International Application No. PCT/KR2018/012676.
International Search Report dated Nov. 26, 2018 in International Application No. PCT/KR2018/005767.
International Search Report dated Aug. 28, 2018 in International Application No. PCT/KR2018/005693.
International Search Report dated Nov. 2, 2018 in International Application No. PCT/KR2018/005306.
Office Action dated Apr. 5, 2019 in Korean Application No. 10-2019-0017393.
Office Action dated Apr. 25, 2019 in Korean Application No. 10-2019-0033722.
Office Action dated Apr. 25, 2019 in Korean Application No. 10-2019-0033723.
Office Action dated Jun. 7, 2021 in Canadian Application No. 3,076,886.
Office Action dated Feb. 9, 2018 in Korean Application No. 10-2017-0058786.
Communication dated Jul. 27, 2020 by the Russian Patent Office in application No. 2020110821.
Communication dated Jun. 11, 2020 by the Korean Patent Office in application No. 10-2018-0051469.
Extended European Search Report dated Jan. 15, 2021 in European Application No. 18799246.6.
Office Action dated May 25, 2020 in Russian Application No. 2019135871.
Office Action dated Jun. 10, 2020 in Korean Application No. 10-2018-0052137.
Office Action dated Oct. 5, 2020 in Korean Application No. 10-2020-0090577.
Office Action dated Oct. 16, 2020 in Korean Application No. 10-2020-0092553.
Extended European Search Report dated Nov. 16, 2020 in European Application No. 20189002.7.
Office Action dated Dec. 8, 2020 in Russian Application No. 2020113632.
Office Action dated Nov. 25, 2020 in Russian Application No. 2020124810.
Office Action dated Jan. 26, 2021 in Japanese Application No. 2020-502671.
Office Action dated Dec. 22, 2020 in Japanese Application No. 2020-502181.
Office Action dated Dec. 22, 2020 in Japanese Application No. 2020-503856.
Extended European Search Report dated Nov. 13, 2020 in European Application No. 20188970.6.
Office Action dated Nov. 10, 2020 in Japanese Application No. 2020-523671.
Office Action dated Nov. 24, 2020 in Russian Application No. 2020124811.
Extended European Search Report dated Oct. 15, 2021 in European Application No. 18872138.5.
Communication dated Dec. 3, 2021 from the Chinese Patent Office in Chinese Application No. 201880049465.2.
Communication dated Dec. 2, 2021 from the Chinese Patent Office in Chinese Application No. 201880048657.1.
Communication dated Dec. 2, 2021 from the Chinese Patent Office in Chinese Application No. 201880048444.9.
Extended European Search Report dated Sep. 9, 2021 in European Application No. 18873562.5.
Office Action dated Aug. 3, 2021 in Japanese Application No. 2020-503856.
Extended European Search Report dated Aug. 18, 2021 in European Application No. 18874344.7.
Extended European Search Report dated Jul. 30, 2021 in European Application No. 18874446.0.
Extended European Search Report dated Aug. 17, 2021 in European Application No. 18872432.2.
Office Action dated Aug. 17, 2021 in Japanese Application No. 2020-503962.
Extended European Search Report dated Aug. 10, 2021 in European Application No. 18873846.2.
Extended European Search Report dated Aug. 17, 2021 in European Application No. 18873943.7.
Extended European Search Report dated Aug. 10, 2021 in European Application No. 18874742.2.
Extended European Search Report dated Aug. 12, 2021 in European Application No. 18874837.0.
Extended European Search Report dated Aug. 20, 2021 in European Application No. 18874962.6.
Extended European Search Report dated Aug. 6, 2021 in European Application No. 18872527.9.

(56) References Cited

OTHER PUBLICATIONS

Extended European Search Report dated Sep. 2, 2021 in European Application No. 18874839.6.
Extended European Search Report dated Jul. 20, 2021 in European Application No. 18872006.4.
Office Action dated Sep. 3, 2021 in Chinese Application No. 201880035480.1.
Office Action dated Aug. 11, 2021 in Chinese Application No. 201880029050.9.
Office Action dated Jan. 24, 2022 in Chinese Application No. 201880030661.5.
Office Action dated Dec. 24, 2021 in Chinese Application No. 201880055847.6.
Office Action dated Dec. 20, 2021 in Chinese Application No. 201880048655.2.
Office Action dated Jan. 4, 2022 in Chinese Application No. 201880048703.8.
Office Action dated Jan. 18, 2022 in Chinese Application No. 201880052857.4.
Office Action dated Jan. 30, 2022 in Chinese Application No. 201880052855.5.
"PCB Design and Processing", Seping, pp. 32-35, Beijing Institute of Technology Publishing House, Feb. 2017, Feb. 28, 2017 (6 pages total).
Office Action dated Dec. 31, 2021 in Chinese Application No. 201880049189.X.
Communication dated Feb. 28, 2022 from the Chinese Patent Office in Chinese Application No. 201880063459.2.
Communication dated Mar. 29, 2022 from the Japanese Patent Office in Japanese Application No. 2020-522897.
Communication dated Mar. 3, 2022 from the Chinese Patent Office in Chinese Application No. 201880058682.8.
Wenxue Geng, "Technology Manual of a Programmable Controller", 1st Edition, 1996, p. 132 (2 pages total).

* cited by examiner

AEROSOL GENERATING DEVICE INCLUDING DETACHABLE VAPORIZER

CROSS REFERENCE TO RELATED APPLICATIONS

This application is a National Stage of International Application No. PCT/KR2018/012776 filed Oct. 26, 2018, claiming priority based on Korean Patent Application No. 10-2017-0142578 filed Oct. 30, 2017 and Korean Patent Application No. 10-2018-0064487 filed Jun. 4, 2018.

TECHNICAL FIELD

Exemplary embodiments of the present disclosure relate to an aerosol-generating device, and more particularly, to a non-combustion aerosol-generating device.

BACKGROUND ART

Recently, the demand for alternative methods to overcome the shortcomings of general cigarettes has increased. For example, there is an increasing demand for a method of generating aerosol by heating an aerosol generating material in cigarettes, rather than by burning cigarettes. Accordingly, studies on a non-combustion aerosol-generating device such as a heating-type cigarette or a heating-type aerosol generating device have been actively conducted.

The aerosol-generating material may be stored in a cartridge provided separately from the cigarette. The aerosol-generating material stored in the cartridge may be heated separately from the cigarette to generate an aerosol, and the cartridge may be replaced to replenish the aerosol-generating material consumed by repeated smoking, and thus the aerosol-generating device may be used continuously.

The above-mentioned background art is technical information possessed by the inventor for the derivation of exemplary embodiments of the present disclosure or acquired in the derivation process, and may not be a known technology disclosed to the general public before the application of the exemplary embodiments of the present disclosure.

DESCRIPTION OF EXEMPLARY EMBODIMENTS

Technical Problem

Exemplary embodiments of the present disclosure provide an aerosol-generating device in which a vaporizer is capable of being attached to and detached from a case for storing an aerosol-generating material.

Exemplary embodiments of the present disclosure provide an aerosol-generating device and method, which are capable of providing a user with a variety of experiences and ease of use by utilizing a combination of an aerosol-generating source and a cigarette.

In addition, in exemplary embodiments of the present disclosure, an aerosol containing a rich flavor, nicotine, and the like may be provided by passing an aerosol, which is generated by heating the aerosol-generating source, through a cigarette.

Solution to Problem

An exemplary embodiment of the present disclosure provides an aerosol-generating device including: a case into which a cigarette is insertable, a vaporizer detachably combined with the case, and a detachment manipulation unit installed in the case and configured to perform, according to user manipulation, a first operation of maintaining a state in which the vaporizer is combined with the case and a second operation of allowing separation of the vaporizer from the case.

In an exemplary embodiment, the detachment manipulation unit may include: a first link member slidable in a horizontal direction according to user manipulation; and a second link member engaged with the first link member and slidable in a vertical direction by a sliding motion of the first link member, and wherein the first link member comprises a button member which is exposed to outside of the case and causes the first link member to slide in the horizontal direction according to user manipulation.

In an exemplary embodiment, the second link member may include a protruding member protruding toward the first link member, wherein the first link member may further include an accommodating groove that accommodates the protruding member, and a portion where the protruding member and the accommodating groove contact each other may be an inclined surface.

In an exemplary embodiment, the detachment manipulation unit may further include an elastic member that elastically presses the second link member to have resilient force in a direction toward the first link member.

In an exemplary embodiment, the case may include a base unit that supports the elastic member.

In an exemplary embodiment, the first link member may further include a first rail member extending in the horizontal direction, and the second link member may further include a second rail member extending in the vertical direction, wherein the case may include: a first guide member accommodated in the first rail member, and a second guide member accommodated in the second rail member, wherein the first rail member may move along the first guide member as the first link member slides in the horizontal direction, and the second rail member may move along the second guide member as the second link member slides in the vertical direction.

In an exemplary embodiment, the first rail member and the second rail member may have shapes of stepped grooves formed at a predetermined interval from surfaces of the first link member and the second link member or shapes of through-holes penetrating the first link member and the second link member, to accommodate the first guide member and the second guide member, respectively.

In an exemplary embodiment, when the detachment manipulation unit is in the first operating state, the first guide member may be engaged with one end of the first rail member to limit sliding movement in a direction in which the first link member is separated from the case.

In an exemplary embodiment, when the detachment manipulation unit is in the second operating state, the first guide member may be engaged with the other end of the first rail member to limit sliding movement in a direction in which the first link member is inserted into the case.

In an exemplary embodiment, when the detachment manipulation unit is in the first operating state, the second guide member may be engaged with one end of the second rail member to limit a sliding movement of the second link member in a direction toward the first link member.

In an exemplary embodiment, when the detachment manipulation unit is in the second operating state, the second guide member may be engaged with the other end of the second rail member to limit a sliding movement of the second link member in an opposite direction opposite of the first link member.

In an exemplary embodiment, the second link member may include a fastening protrusion protruding toward the vaporizer, wherein the vaporizer may include a fastening groove that accommodates the fastening protrusion.

In an exemplary embodiment, the fastening protrusion may include a stopper protruding upward, wherein the fastening groove may be formed upward to accommodate the stopper when the stopper moves upward, wherein the stopper may be accommodated in the fastening groove when the detachment manipulation unit is in the first operating state and thus limit the movement of the vaporizer in the horizontal direction, and may move downward to be separated from the fastening groove when the detachment manipulation unit is in the second operating state and thus allow the vaporizer to move in the horizontal direction.

In an exemplary embodiment, the stopper may include an inclined surface, and when the vaporizer is being combined with the case, the vaporizer may contact the inclined surface and move the stopper downward by sliding over the inclined surface.

In an exemplary embodiment, the case may include a guide hole that exposes the fastening protrusion to the outside as the fastening protrusion penetrates the case, wherein the guide hole may be formed to extend in the vertical direction and thus the fastening protrusion may be movable in the vertical direction along the guide hole.

In an exemplary embodiment, the detachment manipulation unit may include: a first button member which is exposed to outside through one side of the case to be manipulable by a user and is slidable in a vertical direction according to user manipulation; a second button member which is exposed to outside through the other side of the case to be manipulable by a user and is slidable in the vertical direction according to user manipulation; a first sliding member connected to the first button member and installed to be slidable in the vertical direction in one side of the case; and a second sliding member connected to the second button member and installed to be slidable in the vertical direction in the other side of the case.

In an exemplary embodiment, the case may include: a first sliding groove that accommodates the first button member to be slidable in the vertical direction and defines an upper threshold position and a lower threshold position between which the first button member is slidable, and a second sliding groove that accommodates the second button member to be slidable in the vertical direction and defines an upper threshold position and a lower threshold position between which the second button member is slidable.

In an exemplary embodiment, the detachment manipulation unit may further include: a first elastic member that elastically presses the first sliding member in the vertical direction, and a second elastic member that elastically presses the second sliding member in the vertical direction.

In an exemplary embodiment, the case may include: a first rail member that extends in the vertical direction and accommodates the first sliding member to be slidable; a second rail member that extends in the vertical direction and accommodates the second sliding member to be slidable; and a base unit that supports the first elastic member and the second elastic member.

In an exemplary embodiment, the first sliding member may include a first fastening protrusion protruding toward the vaporizer, and the second sliding member may include a second fastening protrusion protruding toward the vaporizer, wherein the vaporizer may include: a first fastening groove that accommodates the first fastening protrusion, and a second fastening groove that accommodates the second fastening protrusion.

In an exemplary embodiment, the first fastening protrusion may include a first stopper protruding upward, and the second fastening protrusion may include a second stopper protruding upward, wherein the first fastening groove may be formed upward to accommodate the first stopper when the first stopper moves upward, and the second fastening groove may be formed upward to accommodate the second stopper when the second stopper moves upward, wherein the first stopper may be accommodated in the first fastening groove when the detachment manipulation unit is in the first operating state and thus limit the movement of the vaporizer in the horizontal direction, and may move downward to be separated from the first fastening groove when the detachment manipulation unit is in the second operating state and thus allow the vaporizer to move in the horizontal direction, wherein the second stopper may be accommodated in the second fastening groove when the detachment manipulation unit is in the first operating state and thus limit the movement of the vaporizer in the horizontal direction, and may move downward to be separated from the second fastening groove when the detachment manipulation unit is in the second operating state and thus allow the vaporizer to move in the horizontal direction.

In an exemplary embodiment, the first stopper and the second stopper may include inclined surfaces, and when the vaporizer is being installed in the case, the vaporizer may contact the inclined surfaces and move the first stopper and the second stopper downward by sliding over the inclined surfaces.

In an exemplary embodiment, the case may include: a first guide hole that exposes the first fastening protrusion to the outside as the first fastening protrusion penetrates the case, and a second guide hole that exposes the second fastening protrusion to the outside as the second fastening protrusion penetrates the case, wherein the first guide hole may be formed to extend in the vertical direction and thus the first fastening protrusion may be movable in the vertical direction along the first guide hole, and the second guide hole may be formed to extend in the vertical direction and thus the second fastening protrusion may be movable in the vertical direction along the second guide hole.

In an exemplary embodiment, the detachment manipulation unit may include: a first link member installed at one side of the case to be rotatable about a first rotation shaft extending from the case toward the vaporizer, and a second link member installed at the other side of the case to be rotatable about a second rotation shaft extending from the case toward the vaporizer, the second link member being engaged with the first link member and being rotatable with the first link member by a rotational movement of the first link member, wherein the first link member may include a button member exposed to the outside through one side of the case such that the first link member rotates about the first rotation shaft according to user manipulation of the button member.

In an exemplary embodiment, the first link member may include a first protruding member extending in a direction toward the second link member, and the second link member may include a second protruding member extending in a direction toward the first link member and contacting the first protruding member, wherein, when the user presses the button member, the first protruding member may rotate about the first rotation shaft, causing the second protruding member to rotate.

In an exemplary embodiment, a surface where the first protruding member and the second protruding member contact each other may be an inclined surface.

In an exemplary embodiment, the detachment manipulation unit may include: a first elastic member that elastically presses the first link member such that a position of the detachment manipulation unit is restored from a position when the detachment manipulation unit is in the second operating state to a position when the detachment manipulation unit is in the first operating state, and a second elastic member that elastically presses the second link member.

In an exemplary embodiment, the case may include a base unit that supports the first elastic member and the second elastic member.

In an exemplary embodiment, the button member may include a locking jaw that extends along an inner wall of the case and limits rotation of the first link member by being engaged with the inner wall of the case when the detachment manipulation unit is in the first operating state.

In an exemplary embodiment, the first link member may include a first fastening protrusion protruding toward the second link member, and the second link member may include a second fastening protrusion protruding toward the first link member, wherein the vaporizer may include: a first fastening groove formed at one side to accommodate the first fastening protrusion, and a second fastening groove formed at the other side to accommodate the second fastening protrusion, wherein the first fastening protrusion and the second fastening protrusion may be respectively accommodated in the first fastening groove and the second fastening groove when the detachment manipulation unit is in the first operating state and limit movement of the vaporizer in the horizontal direction, and may be separated from the first fastening groove and the second fastening groove by rotating about the first rotation shaft and the second rotation shaft, respectively, when the detachment manipulation unit is in the second operating state and allow the vaporizer to move in the horizontal direction.

In an exemplary embodiment, the first fastening protrusion and the second fastening protrusion may include inclined surfaces, wherein, when the vaporizer is being installed in the case, the vaporizer may be slid over the inclined surfaces to move the first fastening protrusion and the second fastening protrusion in a direction toward the position when the detachment manipulation unit is in the second operating state.

In an exemplary embodiment, the detachment manipulation unit may include: a first link member installed at one side of the case to be rotatable about a first rotation shaft extending from the case toward the vaporizer, and a second link member installed at the other side of the case to be rotatable about a second rotation shaft extending from the case toward the vaporizer, wherein the first link member may include a first button member exposed to the outside of one side of the case to rotate the first link member about the first rotation shaft according to the user's manipulation, and the second link member may include a second button member exposed to the outside of the other side of the case to rotate the second link member about the second rotation shaft according to the user's manipulation.

In an exemplary embodiment, the detachment manipulation unit may include: a first elastic member that elastically presses the first link member in a direction in which a position of the detachment manipulation unit is restored from a position when the detachment manipulation unit is in the second operating state to a position when the detachment manipulation unit is in the first operating state, and a second elastic member that elastically presses the second link member.

In an exemplary embodiment, the case may include a base unit that supports the first elastic member and the second elastic member.

In an exemplary embodiment, the first button member may include a first locking jaw that extends along an inner wall of the case and limits rotation of the first link member by being engaged with the inner wall of the case when the detachment manipulation unit is in the first operating state, and the second button member may include a second locking jaw that extends along the inner wall of the case and limits rotation of the second link member by being engaged with the inner wall of the case when the detachment manipulation unit is in the first operating state.

In an exemplary embodiment, the first link member may include a first fastening protrusion protruding toward the second link member, and the second link member may include a second fastening protrusion protruding toward the first link member, wherein the vaporizer may include a first fastening groove formed at one side to accommodate the first fastening protrusion, and a second fastening groove formed at the other side to accommodate the second fastening protrusion, wherein the first fastening protrusion and the second fastening protrusion may be respectively accommodated in the first fastening groove and the second fastening groove when the detachment manipulation unit is in the first operating state and limit movement of the vaporizer in the horizontal direction, and may be separated from the first fastening groove and the second fastening groove by rotating about the first rotation shaft and the second rotation shaft, respectively, when the detachment manipulation unit is in the second operating state and allow the vaporizer to move in the horizontal direction.

In an exemplary embodiment, the first fastening protrusion and the second fastening protrusion may include inclined surfaces, wherein, when the vaporizer is being installed in the case, the vaporizer may slide over the inclined surfaces to move the first fastening protrusion and the second fastening protrusion in a direction toward the position when the detachment manipulation unit is in the second operating state.

Advantageous Effects of Disclosure

According to an aerosol-generating device according to exemplary embodiments of the present disclosure as described above, a vaporizer may be easily attached to and detached from a case through a simple button operation.

In addition, aerosol containing a flavor and nicotine suitable for users may be provided by passing aerosol generated by an aerosol-generating source through a cigarette.

BEST MODE

The present disclosure provides an aerosol-generating device including a case into which a cigarette is insertable, a vaporizer installed to be detachable from the case, and a detachment manipulation unit installed in the case and performing, according to a user's manipulation, a first operation of maintaining a state in which the vaporizer is installed in the case and a second operation of allowing separation of the vaporizer from the case.

MODE OF DISCLOSURE

With respect to the terms in the various exemplary embodiments, the general terms which are currently and widely used are selected in consideration of functions of structural elements in the various exemplary embodiments of the present disclosure. However, meanings of the terms can be changed according to intention, a judicial precedence, the appearance of a new technology, and the like. In addition, in certain cases, a term which is not commonly used can be selected. In such a case, the meaning of the term will be described in detail at the corresponding portion in the description of the present disclosure. Therefore, the terms used in the various exemplary embodiments of the present disclosure should be defined based on the meanings of the terms and the descriptions provided herein.

In addition, unless explicitly described to the contrary, the word "comprise" and variations such as "comprises" or "comprising" will be understood to imply the inclusion of stated elements but not the exclusion of any other elements. In addition, the terms "-er", "-or", and "module" described in the specification mean units for processing at least one function and operation and can be implemented by hardware components or software components and combinations thereof.

Hereinafter, the present disclosure will now be described more fully with reference to the accompanying drawings, in which exemplary embodiments of the present disclosure are shown such that one of ordinary skill in the art may easily work the present disclosure. The disclosure can, however, be embodied in many different forms and should not be construed as being limited to the exemplary embodiments set forth herein.

Hereinafter, exemplary embodiments of the present disclosure will be described in detail with reference to the drawings.

Figure 1:
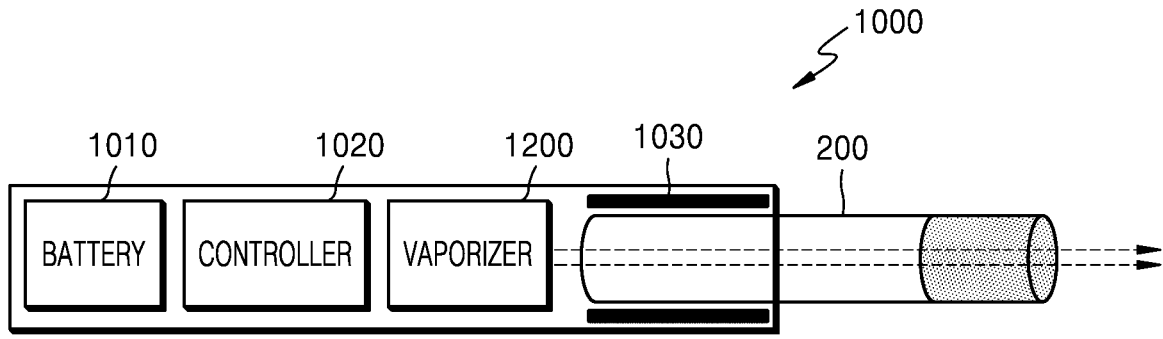
FIGS. 1 and 2 are diagrams showing examples in which a cigarette is inserted into an aerosol generating device.
Figure 2:
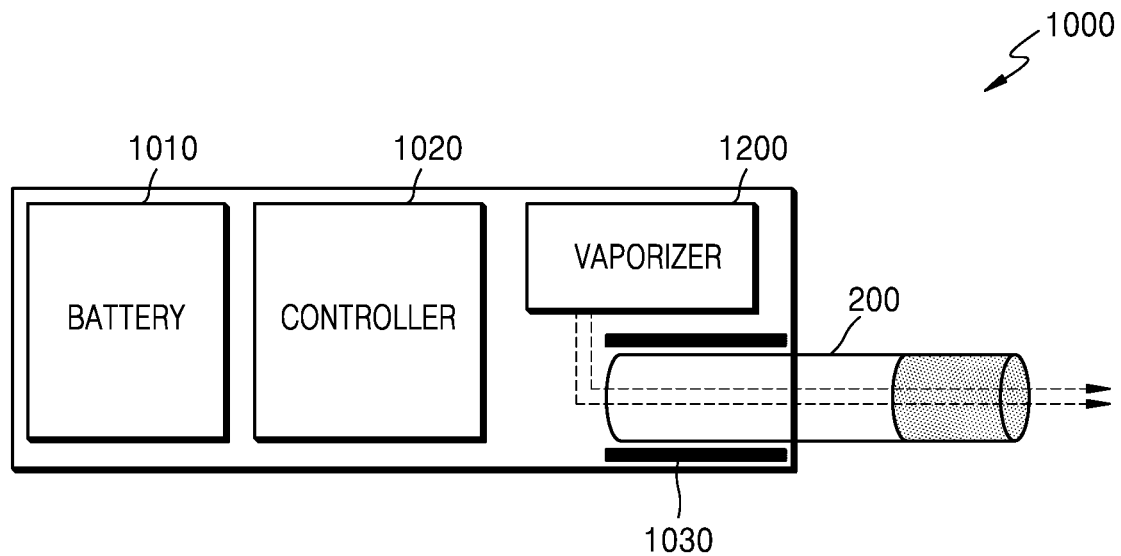

FIGS. 1 and 2 are diagrams showing examples in which a cigarette is inserted into an aerosol generating device.

Referring to FIGS. 1 and 2, an aerosol generating device 1000 includes a battery 1010, a controller 1020, a heater 1030, and a vaporizer 1200. Also, a cigarette 200 may be inserted into an inner space of the aerosol generating device 1000.

FIGS. 1 and 2 illustrate only components of the aerosol generating device 1000, which are related to the present exemplary embodiment. Therefore, it will be understood by one of ordinary skill in the art related to the present exemplary embodiment that other general-purpose components may be further included in the aerosol generating device 1000, in addition to the components illustrated in FIGS. 1 and 2.

Also, FIGS. 1 and 2 illustrate that the aerosol generating device 1000 includes the heater 1030. However, as necessary, the heater 1030 may be omitted.

FIG. 1 illustrates that the battery 1010, the controller 1020, the vaporizer 1200, and the heater 1030 are arranged in series. On the other hand, FIG. 2 illustrates that the vaporizer 1200 and the heater 1030 are arranged in parallel. However, the internal structure of the aerosol generating device 1000 is not limited to the structures illustrated in FIG. 1 or FIG. 2. In other words, according to the design of the aerosol generating device 1000, the battery 1010, the controller 1020, the vaporizer 1200, and the heater 1030 may be differently arranged.

When the cigarette 200 is inserted into the aerosol generating device 1000, the aerosol generating device 1000 may operate the vaporizer 1200 to generate aerosol. The aerosol generated by the vaporizer 1200 is delivered to the user by passing through the cigarette 200. The vaporizer 1200 will be described in more detail later.

The battery 1010 may supply power to be used for the aerosol generating device 1000 to operate. For example, the battery 1010 may supply power to heat the heater 1030 or the vaporizer 1200 and may supply power for operating the controller 1020. Also, the battery 1010 may supply power for operations of a display, a sensor, a motor, etc. mounted in the aerosol generating device 1000.

The controller 1020 may generally control operations of the aerosol generating device 1000. In detail, the controller 1020 may control not only operations of the battery 1010, the heater 1030, and the vaporizer 1200, but also operations of other components included in the aerosol generating device 1000. Also, the controller 1020 may check a state of each of the components of the aerosol generating device 1000 to determine whether or not the aerosol generating device 1000 is in an operable state.

The controller 1020 may include at least one processor. A processor can be implemented as an array of a plurality of logic gates or can be implemented as a combination of a general-purpose microprocessor and a memory in which a program executable in the microprocessor is stored. It will be understood by one of ordinary skill in the art that the processor can be implemented in other forms of hardware.

The heater 1030 may be heated by the power supplied from the battery 1010. For example, when the cigarette 200 is inserted into the aerosol generating device 1000, the heater 1030 may be located outside the cigarette 200 and may increase a temperature of an aerosol generating material in the cigarette 200.

The heater 1030 may include an electro-resistive heater. For example, the heater 1030 may include an electrically conductive track, and the heater 1030 may be heated when currents flow through the electrically conductive track. However, the heater 1030 is not limited to the example described above and may include any other heaters which may be heated to a desired temperature. Here, the desired temperature may be pre-set in the aerosol generating device 1000 or may be set by a user.

As another example, the heater 1030 may include an induction heater. In detail, the heater 1030 may include an electrically conductive coil for heating a cigarette in an induction heating method, and the cigarette may include a susceptor which may be heated by the induction heater.

FIGS. 1 and 2 illustrate that the heater 1030 is positioned outside the cigarette 200, but the position of the cigarette 200 is not limited thereto. For example, the heater 1030 may include a tube-type heating element, a plate-type heating element, a needle-type heating element, or a rod-type heating element, and may heat the inside or the outside of the cigarette 200, according to the shape of the heating element.

Also, the aerosol generating device 1000 may include a plurality of heaters 1030. Here, the plurality of heaters 1030 may be inserted into the cigarette 200 or may be arranged outside the cigarette 200. Also, some of the plurality of heaters 1030 may be inserted into the cigarette 200, and the others may be arranged outside the cigarette 200. In addition, the shape of the heater 1030 is not limited to the shapes illustrated in FIGS. 1 and 2 and may include various shapes.

The vaporizer 1200 may generate aerosol by heating a liquid composition and the generated aerosol may pass through the cigarette 200 to be delivered to a user. In other words, the aerosol generated by the vaporizer 1200 may move along an air flow passage of the aerosol generating device 1000. The air flow passage may be configured such that the aerosol generated by the vaporizer 1200 passes through the cigarette 200 to be delivered to the user.

For example, the vaporizer 1200 may include a liquid storage, a liquid delivery element, and a heating element, but it is not limited thereto. For example, the liquid storage, the liquid delivery element, and the heating element may be included in the aerosol generating device 1000 as independent modules.

The liquid storage may store a liquid composition. For example, the liquid composition may be a liquid including a tobacco-containing material having a volatile tobacco flavor component, or a liquid including a non-tobacco material. The liquid storage may be attachable to and detachable from the vaporizer 1200. Alternatively, the liquid storage may be formed integrally with the vaporizer 1200.

For example, the liquid composition may include water, a solvent, ethanol, plant extract, spices, flavorings, or a vitamin mixture. The spices may include menthol, peppermint, spearmint oil, and various fruit-flavored ingredients, but are not limited thereto. The flavorings may include ingredients capable of providing various flavors or tastes to a user. Vitamin mixtures may be a mixture of at least one of vitamin A, vitamin B, vitamin C, and vitamin E, but are not limited thereto. Also, the liquid composition may include an aerosol forming substance, such as glycerin and propylene glycol.

The liquid delivery element may deliver the liquid composition of the liquid storage to the heating element. For example, the liquid delivery element may be a wick such as cotton fiber, ceramic fiber, glass fiber, or porous ceramic, but is not limited thereto.

The heating element is an element for heating the liquid composition delivered by the liquid delivery element. For example, the heating element may be a metal heating wire, a metal hot plate, a ceramic heater, or the like, but is not limited thereto. In addition, the heating element may include a conductive filament such as nichrome wire and may be wound around the liquid delivery element. The heating element may be heated by electrical current and may transfer heat to the liquid composition in contact with the heating element, thereby heating the liquid composition. As a result, aerosol may be generated.

For example, the vaporizer 1200 may be referred to as a cartomizer or an atomizer, but it is not limited thereto.

The aerosol generating device 1000 may further include general-purpose components in addition to the battery 1010, the controller 1020, and the heater 1030. For example, the aerosol generating device 1000 may include a display capable of outputting visual information and/or a motor for outputting haptic information. Also, the aerosol generating device 1000 may include at least one sensor (a puff detecting sensor, a temperature detecting sensor, a cigarette insertion detecting sensor, etc.). Also, the aerosol generating device 1000 may be formed as a structure where, even when the cigarette 200 is inserted into the aerosol generating device 1000, external air may be introduced or internal air may be discharged.

Although not illustrated in FIGS. 1 and 2, a cradle may be used with the aerosol generating device 1000 as a system. For example, the cradle may be used to charge the battery 1010 of the aerosol generating device 1000. Alternatively, the heater 1030 may be heated when the cradle and the aerosol generating device 1000 are coupled to each other.

The cigarette 200 may be similar to a general combustive cigarette. For example, the cigarette 200 may be divided into a first portion including an aerosol generating material and a second portion including a filter, etc. Alternatively, the second portion of the cigarette 200 may also include an aerosol generating material. For example, an aerosol generating material made in the form of granules or capsules may be inserted into the second portion.

The entire first portion may be inserted into the aerosol generating device 1000, and the second portion may be exposed to the outside. Alternatively, the first portion may be partially inserted into the aerosol generating device 1000. Otherwise, the first portion and a part of the second portion may be inserted into the aerosol generating device 1000. The user may puff aerosol while holding the second portion by the mouth of the user. In this case, the aerosol is generated by the external air passing through the first portion, and the generated aerosol passes through the second portion and is delivered to the user's mouth.

For example, the external air may flow into at least one air passage formed in the aerosol generating device 1000. For example, opening and closing of the air passage and/or a size of the air passage may be adjusted by the user. Accordingly, the amount of smoke and a smoking impression may be adjusted by the user. As another example, the external air may flow into the cigarette 200 through at least one hole formed in a surface of the cigarette 200.

Hereinafter, an example of the cigarette 200 will be described with reference to FIG. 3.

Figure 3:
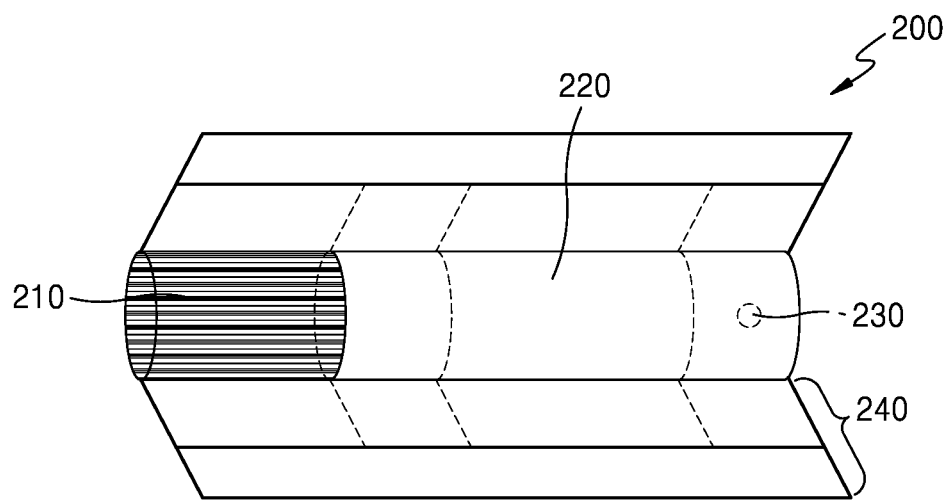
FIG. 3 is a drawing illustrating an example of a cigarette.

FIG. 3 is a drawing illustrating an example of a cigarette.

Referring to FIG. 3, the cigarette 200 may include a tobacco rod 210 and a filter rod 220. The first portion described above with reference to FIGS. 1 and 2 may include the tobacco rod 210, and the second portion may include the filter rod 220.

FIG. 3 illustrates that the filter rod 220 includes a single segment. However, the filter rod 220 is not limited thereto. In other words, the filter rod 220 may include a plurality of segments. For example, the filter rod 220 may include a first segment configured to cool aerosol and a second segment configured to filter a certain component included in the aerosol. Also, as necessary, the filter rod 220 may further include at least one segment configured to perform other functions.

The cigarette 2000 may be packaged using at least one wrapper 240. The wrapper 240 may have at least one hole through which external air may be introduced or internal air may be discharged. For example, the cigarette 200 may be packaged using one wrapper 240. As another example, the cigarette 200 may be doubly packaged using at least two wrappers 240. For example, the tobacco rod 210 may be packaged using a first wrapper, and the filter rod 220 may be packaged using a second wrapper. Also, the tobacco rod 210 and the filter rod 220, which are respectively packaged using separate wrappers, may be combined and packaged together using a third wrapper. When each of the tobacco rod 210 and the filter rod 220 includes a plurality of segments, each segment may be packaged using a separate wrapper. Also, the entire cigarette 200 including the plurality of segments, which are respectively packaged using the separate wrappers and which are coupled to each other, may be re-packaged using another wrapper.

The tobacco rod 210 may include an aerosol generating material. For example, the aerosol generating material may include at least one of glycerin, propylene glycol, ethylene glycol, dipropylene glycol, diethylene glycol, triethylene glycol, tetraethylene glycol, and oleyl alcohol, but it is not limited thereto. Also, the tobacco rod 210 may include other additives, such as flavors, a wetting agent, and/or organic acid. Also, the tobacco rod 210 may include a flavored liquid, such as menthol or a moisturizer, which is injected to the tobacco rod 210.

The tobacco rod 210 may be manufactured in various forms. For example, the tobacco rod 210 may be formed as a sheet or a strand. Also, the tobacco rod 210 may be formed as a pipe tobacco, which is formed of tiny bits cut from a tobacco sheet. Also, the tobacco rod 210 may be surrounded by a heat conductive material. For example, the heat-conducting material may be, but is not limited to, a metal foil such as aluminum foil. For example, the heat conductive material surrounding the tobacco rod 210 may uniformly distribute heat transmitted to the tobacco rod 210, and thus, the heat conductivity applied to the tobacco rod may be increased and taste of the tobacco may be improved. Also, the heat conductive material surrounding the tobacco rod 210 may function as a susceptor heated by the induction heater. Here, although not illustrated in the drawings, the tobacco rod 210 may further include an additional susceptor, in addition to the heat conductive material surrounding the tobacco rod 210.

The filter rod 220 may include a cellulose acetate filter. Shapes of the filter rod 220 are not limited. For example, the filter rod 220 may include a cylinder-type rod or a tube-type rod having a hollow inside. Also, the filter rod 220 may include a recess-type rod. When the filter rod 220 includes a plurality of segments, at least one of the plurality of segments may have a different shape.

The filter rod 220 may be formed to generate flavors. For example, a flavoring liquid may be injected onto the filter rod 220, or an additional fiber coated with a flavoring liquid may be inserted into the filter rod 220.

Also, the filter rod 220 may include at least one capsule 230. Here, the capsule 230 may generate a flavor or an aerosol. For example, the capsule 230 may have a configuration in which a liquid containing a flavoring material is wrapped with a film. For example, the capsule 230 may have a spherical or cylindrical shape, but is not limited thereto.

When the filter rod 220 includes a segment configured to cool the aerosol, the cooling segment may include a polymer material or a biodegradable polymer material. For example, the cooling segment may include pure polylactic acid alone, but the material for forming the cooling segment is not limited thereto. In an exemplary embodiments, the cooling segment may include a cellulose acetate filter having a plurality of holes. However, the cooling segment is not limited to the above-described example and any other cooling segment that is capable of cooling the aerosol may be used.

Although not illustrated in FIG. 3, the cigarette 200 according to an exemplary embodiment may further include a front-end filter. The front-end filter may be located on a side of the tobacco rod 210, which is away from the filter rod 220. The front-end filter may prevent the tobacco rod 210 from being detached and prevent the liquefied aerosol from flowing into the aerosol generating device 1000 (FIGS. 1 and 2) from the tobacco rod 210, during smoking.

Hereinafter, a structure in which a case 1100 and a vaporizer 1200 of an aerosol-generating device 1000 according to exemplary embodiments of the present disclosure are combined will be described in detail with reference to FIGS. 4 to 15B.

Figure 4:
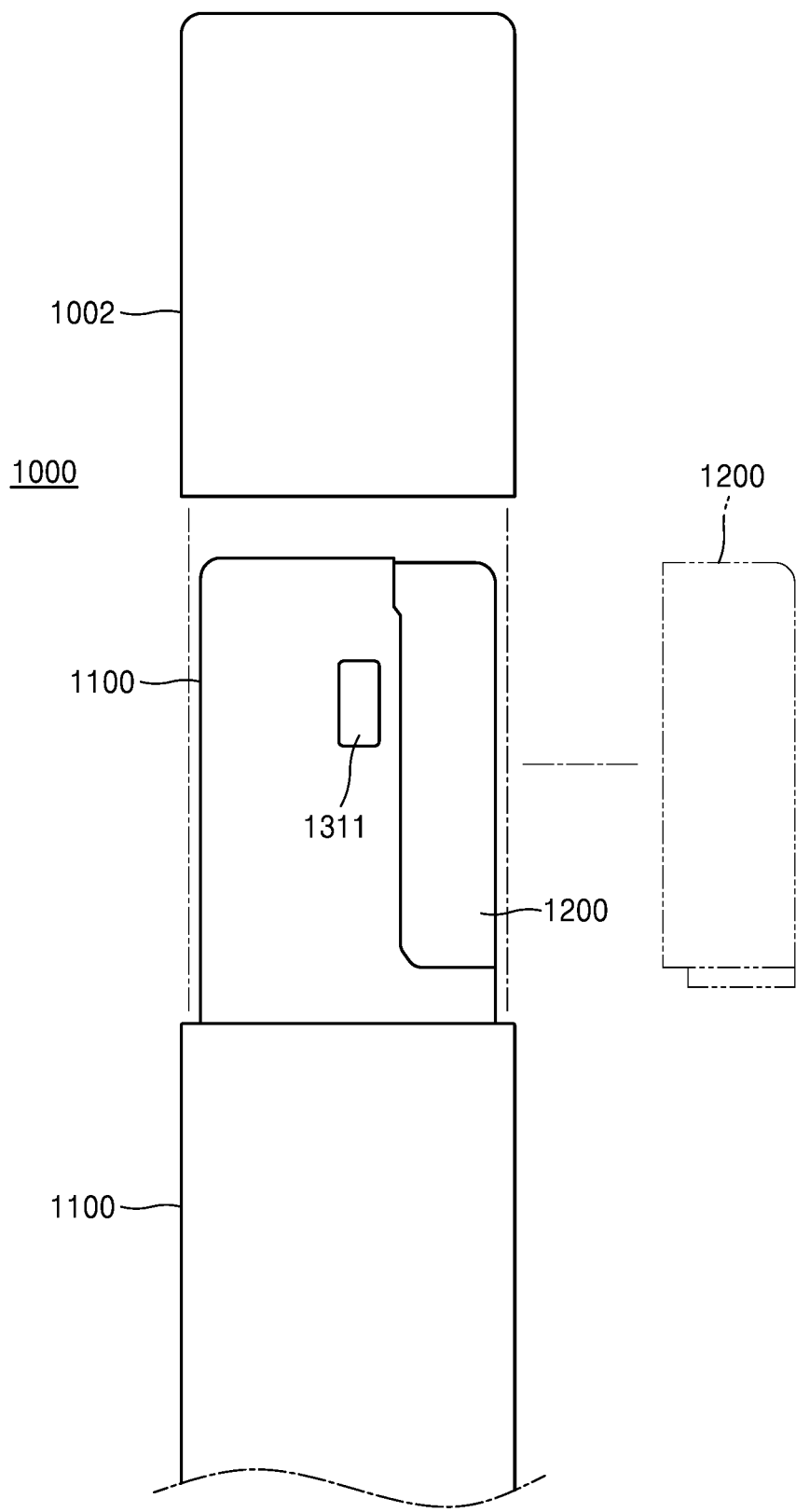
FIG. 4 is an exploded side view illustrating the appearance of an aerosol-generating device according to an exemplary embodiment of the present disclosure.
Figure 5:
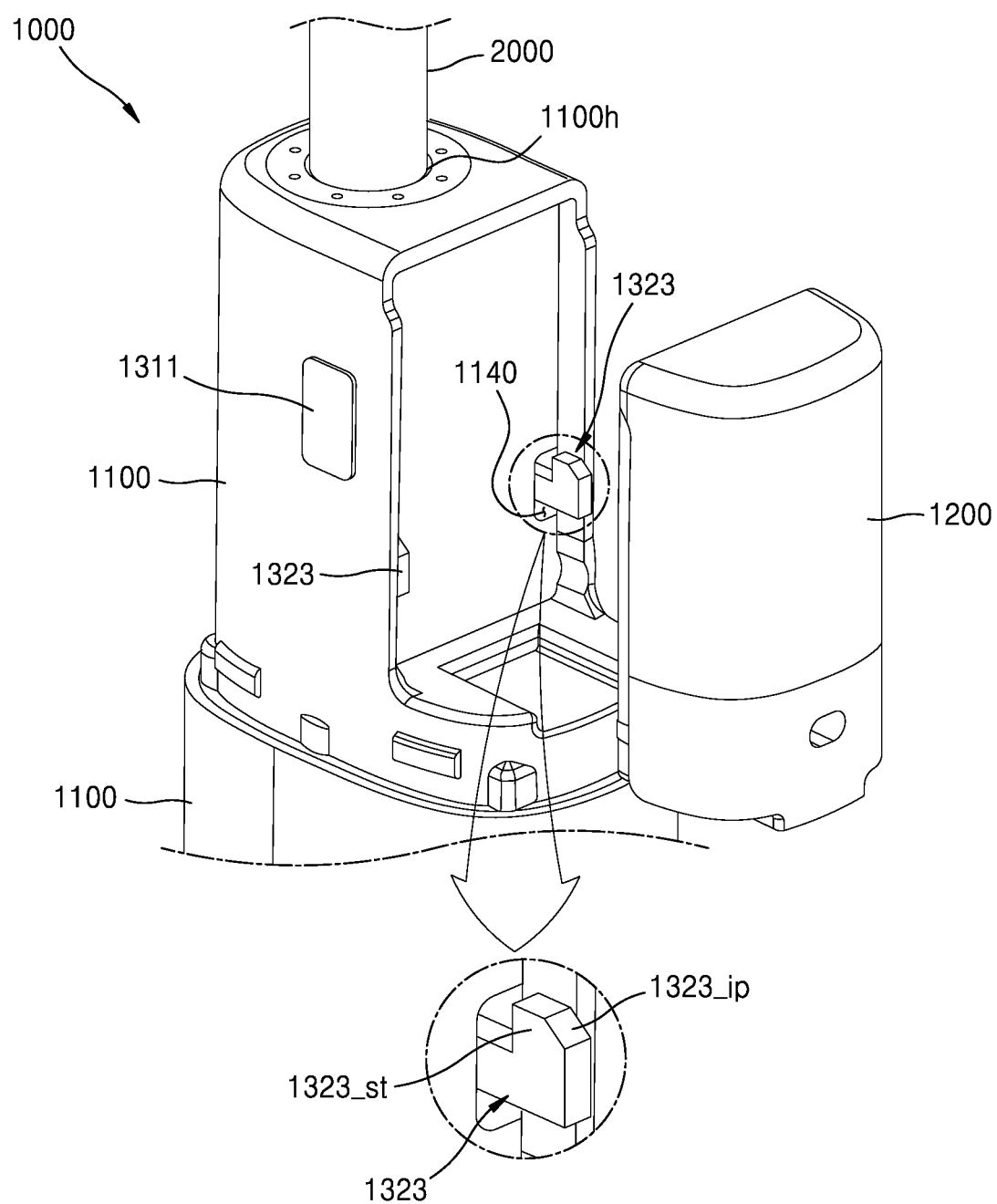
FIG. 5 is an exploded perspective view illustrating a state in which a vaporizer of the aerosol-generating device shown in FIG. 4 is separated from a case.

FIG. 4 is an exploded side view of the aerosol-generating device 1000 according to an exemplary embodiment of the present disclosure, and FIG. 5 is an exploded perspective view illustrating a state in which the vaporizer 1200 of the aerosol-generating device 1000 shown in FIG. 4 is separated from the case 1100.

The aerosol-generating device 1000 shown in FIGS. 4 and 5 may include the case 1100, the vaporizer 1200, and a cover 1002. The cover 1002 may be coupled to one end of the case 1100 such that the case 1100 and the cover 1002 may together form the exterior of the aerosol-generating device 1000.

The case 1100 forms a portion of the exterior of the aerosol-generating device 1000 and has a function of accommodating and protecting various components including a battery 1010, a controller 1020, and a heater 1030 shown in FIGS. 1 and 2. In addition, an outer hole 1100h into which a cigarette 200 may be inserted is formed in an upper surface of the cover 1002 coupled to the case 1100.

The case 1100 and the cover 1002 may include a plastic material that does not transfer heat well, or a metal material coated with a thermal barrier material on its surface. The case 1100 and the cover 1002 may be manufactured by, for example, injection molding, three-dimensional (3D) printing, or assembling small parts manufactured by injection molding.

A holding device (not shown) may be installed between the case 110 and the cover 1002 to maintain a coupling state between the case 1100 and the cover 1002. The holding device may include, for example, a protrusion and a groove. By maintaining a state in which the protrusion is inserted into the groove, the cover 1002 and the case 1001 may be held in a coupled state, and the protrusion may be separated from the groove by moving the protrusion when a user presses an operation button.

In addition, the holding device may include, for example, a magnet and a metal member that adheres to the magnet. When the magnet is used in the holding device, the magnet may be installed in one of the case 1100 and the cover 1002 and the metal member that adheres to the magnet may be installed in the other. Otherwise, the magnet may be installed in both the case 1100 and the cover 1002.

In the aerosol-generating device 1000 shown in FIG. 4, the cover 1002 is not an essential component, and thus, the cover 1002 may be omitted if necessary.

In addition, the vaporizer 1200 is installed at one end of the case 1100 in a detachable manner. A button member 1311 shown in FIG. 4 is a part of a detachment manipulation unit 1300 shown in FIG. 6A, which will be described later, and the user may press the button member 1311 to separate the case 1100 and the vaporizer 1200.

The detachment manipulation unit 1300 will be described in detail below. Referring to FIG. 5, when the user presses the button member 1311, a fastening protrusion 1323 which is insertable into the vaporizer 1200 may slide in a vertical direction along a guide hole 1140 formed in the case 1100. As a result, the case 1100 and the vaporizer 1200 may be fastened to each other or separated from each other.

FIGS. 4 and 5 illustrate a state in which the vaporizer 1200 is installed in the case 1100 by being pushed from the side. However, the exemplary embodiments are not limited thereto. For example, the vaporizer 1200 may be installed in the case 1100 by being pushed in the vertical direction from the upper side of the case 1100 like the cover 1002. However, hereinafter, the description will be made based on a structure in which the vaporizer 1200 is installed in the case 1100 by being pushed from the side of the case 1100, for convenience of description.

Figure 6A:
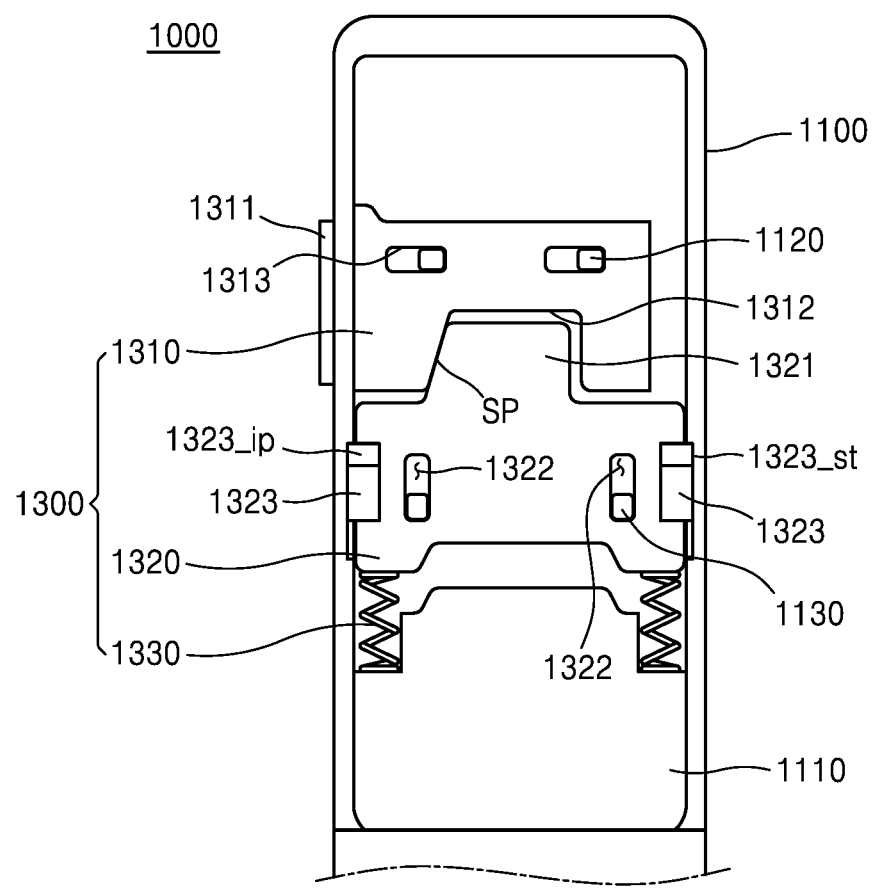
FIG. 6A is a front view illustrating a state in which a detachment manipulation unit of the aerosol-generating device of FIG. 5 is in a first operating state.
Figure 6B:
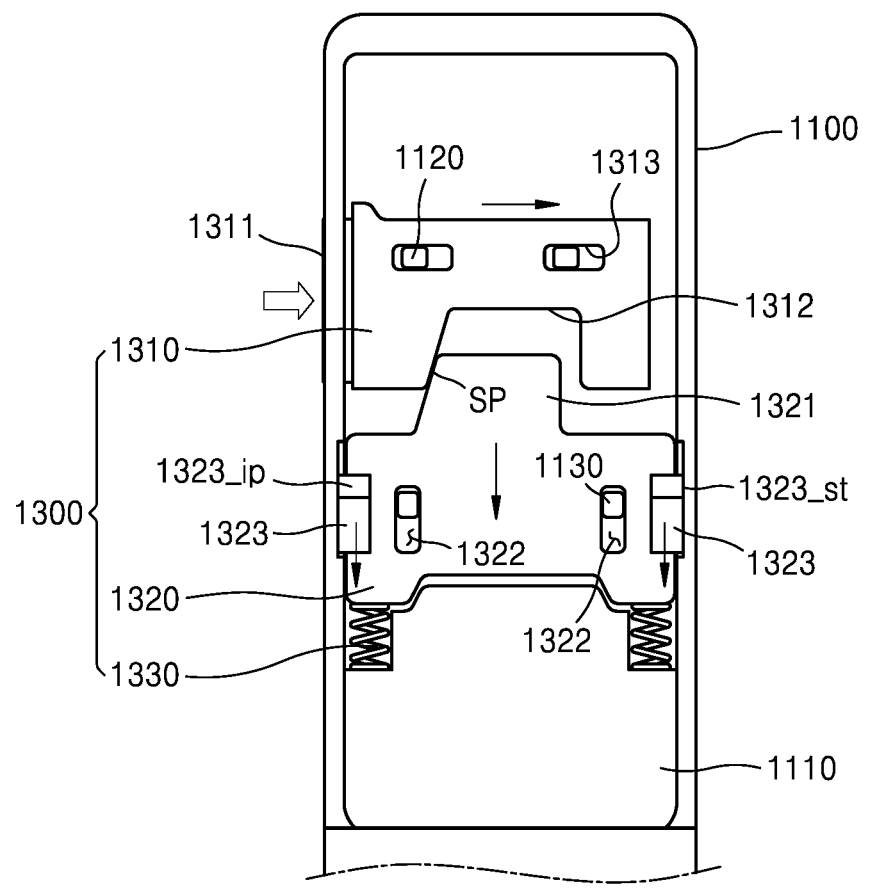
FIG. 6B is a front view illustrating a state in which the detachment manipulation unit of the aerosol-generating device of FIG. 5 is in a second operating state.

FIG. 6A is an exploded front view of the aerosol-generating device 1000 when the detachment manipulation unit 1300 of FIG. 5 is in a first operating state, and FIG. 6B is an exploded front view of the aerosol-generating device 1000 when the detachment manipulation unit 1300 of FIG. 5 is in a second operating state.

Referring to FIGS. 6A and 6B, the aerosol-generating device 1000 includes the detachment manipulation unit 1300. The detachment manipulation unit 1300 is installed in the case 1100 and performs, according to a user's manipulation, a first operation (see FIG. 6A) of maintaining a state in which the vaporizer 1200 is installed in the case 1100, and a second operation (see FIG. 6B) of allowing separation of the vaporizer 1200 from the case 1100.

Specifically, the detachment manipulation unit 1300 includes a first link member 1310 that can slide in a horizontal direction according to a user's manipulation and a second link member 1320 engaged with the first link member 1310. The second link member 1320 can slide in the vertical direction by a sliding movement of the first link member 1310.

In addition, the first link member 1310 includes a button member 1311 exposed to the outside of the case 1100, which causes the first link member 1310 to slide in the horizontal direction according to a user's manipulation.

The second link member 1320 includes a protruding member 1321 protruding toward the first link member 1310. The first link member 1310 includes an accommodating groove 1312 accommodating the protruding member 1321 of the second link member 1320, and a portion of a surface where the protruding member 1321 and the accommodating groove 1312 contact each other may be an inclined surface SP.

In addition, the detachment manipulation unit 1300 further includes an elastic member 1330 that elastically presses the second link member 1320 to have resilience in a direction toward the first link member 1310, and the case 1100 includes a base unit 1100 that supports the elastic member 1330.

The first link member 1310 further includes a first rail member 1313 extending in the horizontal direction, and the second link member 1320 further includes a second rail member 1322 extending in the vertical direction. The case 1100 includes a first guide member 1120 accommodated in the first rail member 1313 and a second guide member 1130 accommodated in the second rail member 1322.

The first rail member 1313 may move along the first guide member 1120 with the sliding movement of the first link member 1310 in the horizontal direction, and the second rail member 1322 may move along the second guide member 1130 with the movement of the second link member 1320 in the vertical direction.

In the drawings, the first rail member 1313 and the second rail member 1322 are depicted as through-holes penetrating the first link member 1310 and the second link member 1320 to accommodate the first guide member 1120 and the second guide member 1130, respectively. However, the exemplary embodiments are not limited thereto. For example, the first rail member 1313 and the second rail member 1322 may be formed as stepped grooves in the surfaces of the first link member 1310 and the second link member 1320 at a predetermined interval in a thickness direction, to accommodate the first guide member 1120 and the second guide member 1130, respectively.

As shown in FIG. 6A, when the detachment manipulation unit 1300 is in the first operating state, the first guide member 1120 may be engaged with one end of the first rail member 1313. Thus, the first link member 1310 is kept from sliding further in a direction away from the case 1100 so the first link member 1310 is not separated from the case 1100. In addition, as shown in FIG. 6B, when the detachment manipulation unit 1300 is in the second operating state, the first guide member 1120 may be engaged with the other end of the first rail member 1313. Thus, the first link member 1310 is kept from sliding further into the case 1100.

That is, in the first operating state of the detachment manipulation unit 1300 in which the user does not press the button member 1311, the first guide member 1310 may be arranged to engage with a right end portion of the first rail member 1313 to prevent the first link member 1310 from being separated from the case 1100 due to the movement of the first link member 1310 to the left. According to this structure, the first rail member 1313 may not move further left than the position of the first guide member 1120. That is, since the first link member 1310 may not move further left than a position defined by the first guide member 1120, the first link member 1310 may slide in the case 1100 without being separated from the case 1100 under any circumstances.

In addition, in the second operating state of the detachment manipulation unit 1300 in which the user presses the button member 1311, the first guide member 1120 may be arranged to engage with a left end portion of the first rail member 1313 to prevent the first link member 1310 from being inserted in an inner space of the case 1100 due to the movement of the first link member 1310 to the right. According to this structure, the first rail member 1313 may not move further right than the position of the first guide member 1120. That is, since the first link member 1310 may not move further right than a position defined by the first guide member 1120, the first link member 1310 may prevent the button member 1311 from being inserted into the inner space of the case 1100 under any circumstances.

In addition, as shown in FIG. 6A, when the detachment manipulation unit 1300 is in the first operating state, the second guide member 1130 may be engaged with a lower end of the second rail member 1322 and thus limit the sliding movement of the second link member 1320 in an upward direction. In addition, as shown in FIG. 6B, when the detachment manipulation unit 1300 is in the second operating state, the second guide member 1130 may be engaged with an upper end of the second rail member 1322 and thus limit the sliding movement of the second link member 1320 in a downward direction.

That is, in the first operating state of the detachment manipulation unit 1300 in which the user does not press the button member 1311, the second guide member 1130 may be arranged to engage with a lower end portion of the second rail member 1322 to prevent the first link member 1310 from being pressed upward due to the upward movement of the second link member 1320. According to this structure, the second rail member 1322 may not move up further than the position of the second guide member 1130. That is, since the second link member 1320 may not move up further than a position defined by the second guide member 1130, a sliding movement of the second link member 1320 in the vertical direction may be restricted. As such, the first link member 1310 may be kept from being damaged by excessive force applied by the upward movement of the second link member 1320.

In addition, in the second operation state of the detachment manipulation unit 1300 in which the user presses the button member 1311, the second guide member 1130 may be arranged to engage with an upper end portion of the second rail member 1322 to prevent the base unit 1110 from being pressed downward due to the downward movement of the second link member 1320. According to this structure, the second rail member 1322 may not move down further than the position of the second guide member 1130. That is, since the second link member 1320 may not move down further than a position defined by the second guide member 1130, the sliding movement of the second link member 1320 in the vertical direction may be restricted. As such, the base unit 1110 may be kept from being damaged by excessive force applied by the downward movement of the second link member 1320.

The second link member 1320 includes a fastening protrusion 1323 protruding toward the vaporizer 1200. The fastening protrusion 1323 may move up and down with the vertical sliding movement of the second link member 1320. The vaporizer 1200 may be installed in or separated from the case 1100 according to the up-and-down movement of the fastening protrusion 1323. The structure in which the fastening protrusion 1323 and the vaporizer 1200 are fastened will be described in detail with reference to FIGS. 7 and 8.

According to the above-described structure, the user may change the fastening structure of the case 1100 and the vaporizer 1200 by pressing the button member 1311 exposed to the outside of the case 1100. FIG. 6B depicts how each component of the detachment manipulation unit 1300 moves when the user presses the button member 1311.

Referring to FIG. 6B, when the user presses the button member 1311, the first link member 1310 connected to the button member 1311 may also slide in a direction in which the user presses the button member 1311, that is, to the right. The button member 1311 and the first link member 1310 may be made from different materials, or the button member 1311 and the first link member 1310 may be integrally formed using the same material.

When the first link member 1310 slides to the right, the second link member 1320 in engagement with the first link member 1310 through the inclined surface SP slides downward as the inclined surface SP slides downward. In accordance with this operation, the fastening protrusion 1323 also moves downward, and thus, when the vaporizer 1200 is installed in the case 1100, the vaporizer 1200 may be separated from the case 1100. Also, when the vaporizer 1200 is not installed in the case 1100, the vaporizer 1200 may be installed into the case 1100.

As shown in FIG. 6B, when the second link member 1320 is slid downward, the elastic member 1330 is compressed, and with the restoring force thereof, the elastic member 1330 may press the second link member 1320 in an upward direction. That is, when the user installs the vaporizer 1200 in the case 1100 while pressing the button member 1311 and then releases the button member 1311, the fastening protrusion 1323 may move upward by the restoring force of the elastic member 1330 to fix the vaporizer 1200 to the case 1100.

Hereinafter, with reference to FIGS. 7 and 8, how the vaporizer 1200 is installed in or separated from the case 1100 by the up-and-down movement of the fastening protrusion 1323 will be described in detail.

Figure 7:
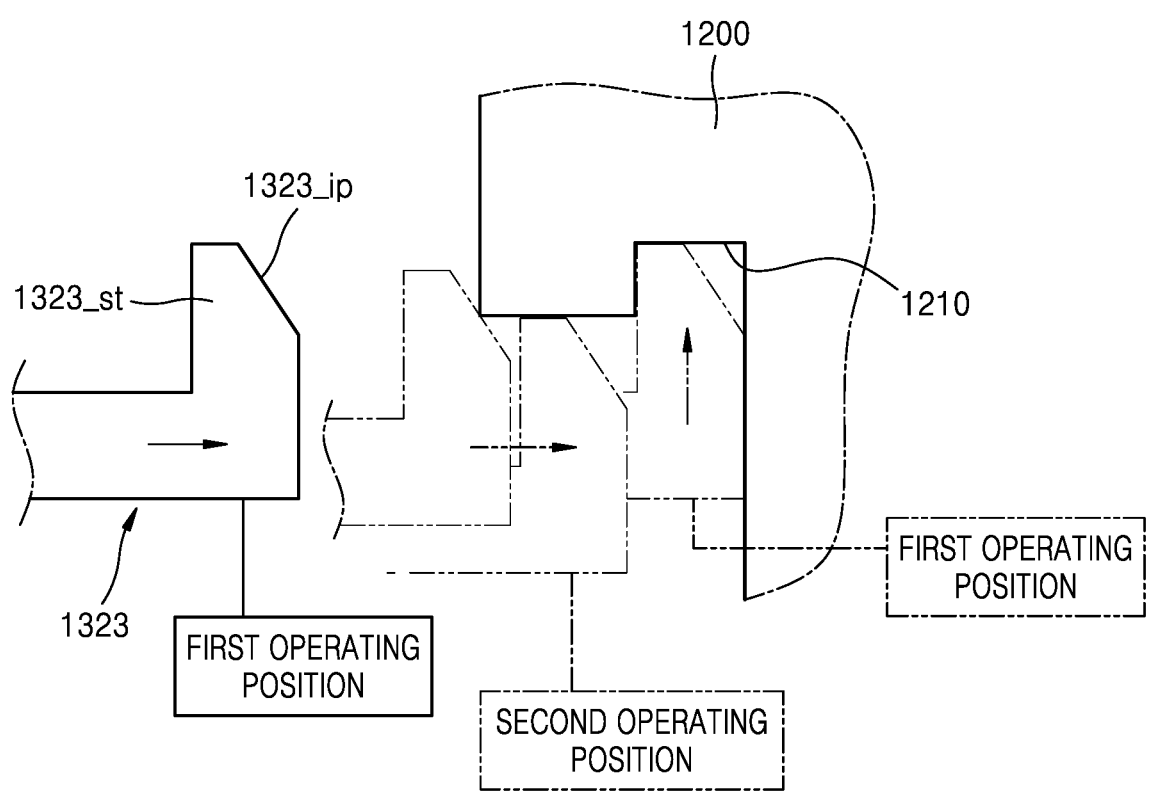
FIG. 7 is a cutaway side view illustrating a state in which a vaporizer is installed in a case through coupling with a detachment manipulation unit while a user does not press a button member.
Figure 8:
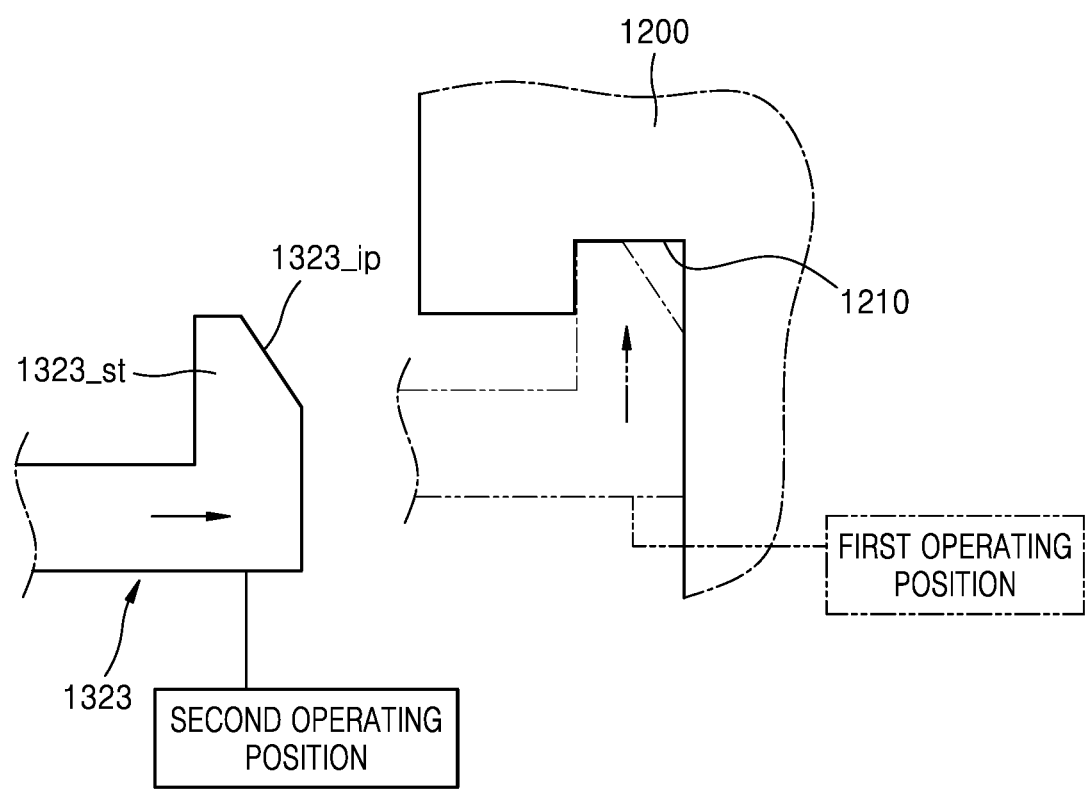
FIG. 8 is a cutaway side view illustrating a state in which a vaporizer is installed in a case through coupling with a detachment manipulation unit while a user presses a button member.

FIG. 7 is a cutaway side view illustrating a state in which a vaporizer is installed in a case through coupling with a detachment manipulation unit while the user does not press a button member, and FIG. 8 is a cutaway side view illustrating a state in which a vaporizer is installed in a case through coupling with a detachment manipulation unit while the user presses a button member.

Referring to FIGS. 7 and 8, the vaporizer 1200 includes a fastening groove 1210 that accommodates the fastening protrusion 1323.

The fastening protrusion 1323 includes a stopper 1323_st protruding upward, and the fastening groove 1210 is formed upward to accommodate the stopper 1323_st when the stopper 1323_st moves upward (a first operating position). That is, when the detachment manipulation unit 1300 is in the first operating state, the stopper 1323_st is accommodated in the fastening groove 1210 to limit the movement of the vaporizer 1200 in the horizontal direction. In addition, when the detachment manipulation unit 1300 is in the second operating state, the stopper 1323_st moves downward (a second operating position) to be separated from the fastening groove 1210 and allows the vaporizer 1200 to move in the horizontal direction.

Specifically, the stopper 1323_st includes an inclined surface 1323_ip, and when the vaporizer 1200 is being installed in the case 1100 without the user pressing the button member 1311, the vaporizer 1200 may contact the inclined surface 1323_ip of the stopper 1323_st and move the stopper 1323_st downward by sliding over the inclined surface 1323_ip, as shown in FIG. 7.

In this state, when the vaporizer 1200 is continuously pushed toward the case 1100, the stopper 1323_st may be fitted into the fastening groove 1210 and thus the vaporizer 1200 may be installed in the case 1100.

According to the above structure, the user may mount the vaporizer 1200 in the case 1100 without pressing the button member 1311. As shown in FIG. 8, in a state in which the button member 1311 is pressed, the vaporizer 1200 may be easily mounted in the case 1100 without the inclined surface 1323_ip of the stopper 1323_st contacting the vaporizer 1200. On the contrary, when the vaporizer 1200 is to be separated from the case 1100, the user has to press the button member 1311 to move the stopper 1323_st downward.

Figure 9:
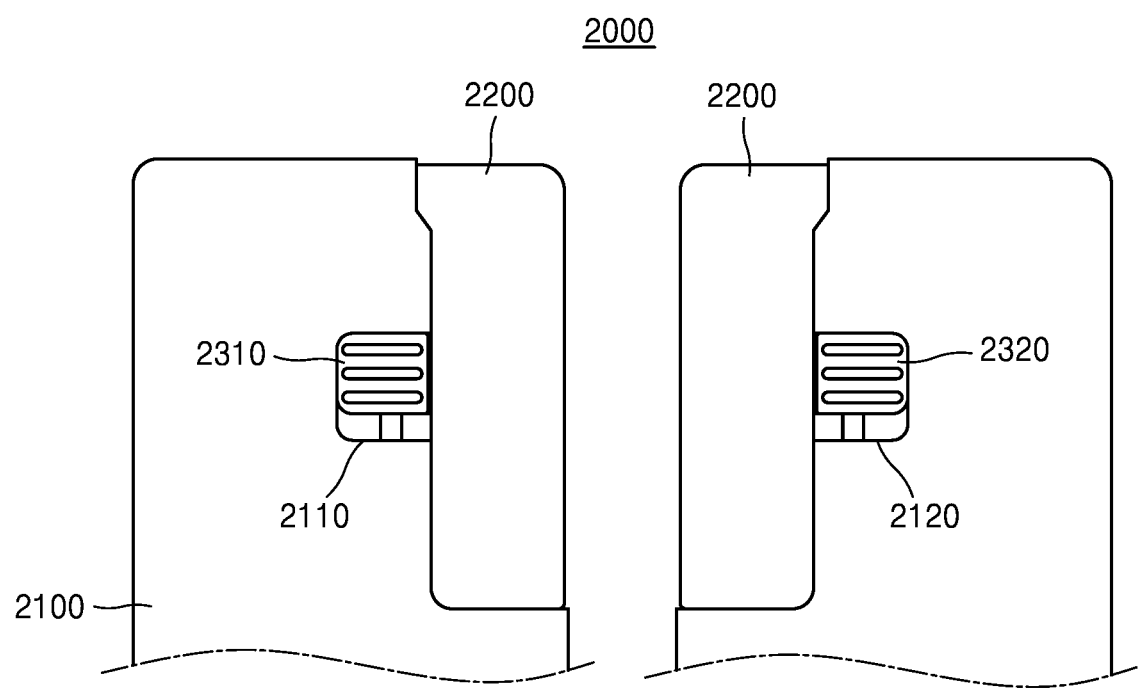
FIG. 9 is a side view illustrating the appearance of an aerosol-generating device according to another exemplary embodiment of the present disclosure.

FIG. 9 is a side view illustrating the exterior of an aerosol-generating device according to another exemplary embodiment of the present disclosure.

The aerosol-generating device 2000 shown in FIG. 9 may include a first button member 2310 and a second button member 2320 installed to be slidable in the vertical direction on both sides of a case 2100. The user may manipulate the first button member 2310 and the second button member 2320 to attach a vaporizer 2200 to or detach the vaporizer 2200 from the case 1100. The first button member 2310 and the second button member 2320 shown in FIG. 9 are components of a detachment manipulation unit 2300 of FIG. 10A, which will be described later. The user may release fastening between the case 2100 and the vaporizer 2200 by simultaneously pressing the first button member 2310 and the second button member 2320.

Although not illustrated in FIG. 9, similar to FIG. 5, the case 2100 may include a first guide hole exposing a first fastening protrusion 2331 to the outside as the first fastening protrusion 2331 penetrates the case 2100, and a second guide hole exposing a second fastening protrusion 2341 to the outside as the second fastening protrusion 2341 penetrates the case 2100. The first guide hole and the second guide hole may have the same structure as the guide hole 1140 in FIG. 5. The first guide hole is formed to extend in the vertical direction and thus the first fastening protrusion 2331 may be movable in the vertical direction along a first guide groove, and the second guide hole is formed to extend in the vertical direction and thus the second fastening protrusion 2341 may be movable in the vertical direction along a second guide groove.

The detachment manipulation unit 2300 will be described in detail below. Referring to FIG. 9, when the user presses both the first button member 2310 and the second button member 2320 at both sides of the case 2100, the first fastening protrusion 2331 and the second fastening protrusion 2341, which may be inserted into the vaporizer 2200, may respectively slide in the vertical direction along the first guide hole and the second guide hole formed in the case 2100. As a result, the case 2100 and the vaporizer 2200 may be fastened to each other or separated from each other.

Figure 10A:
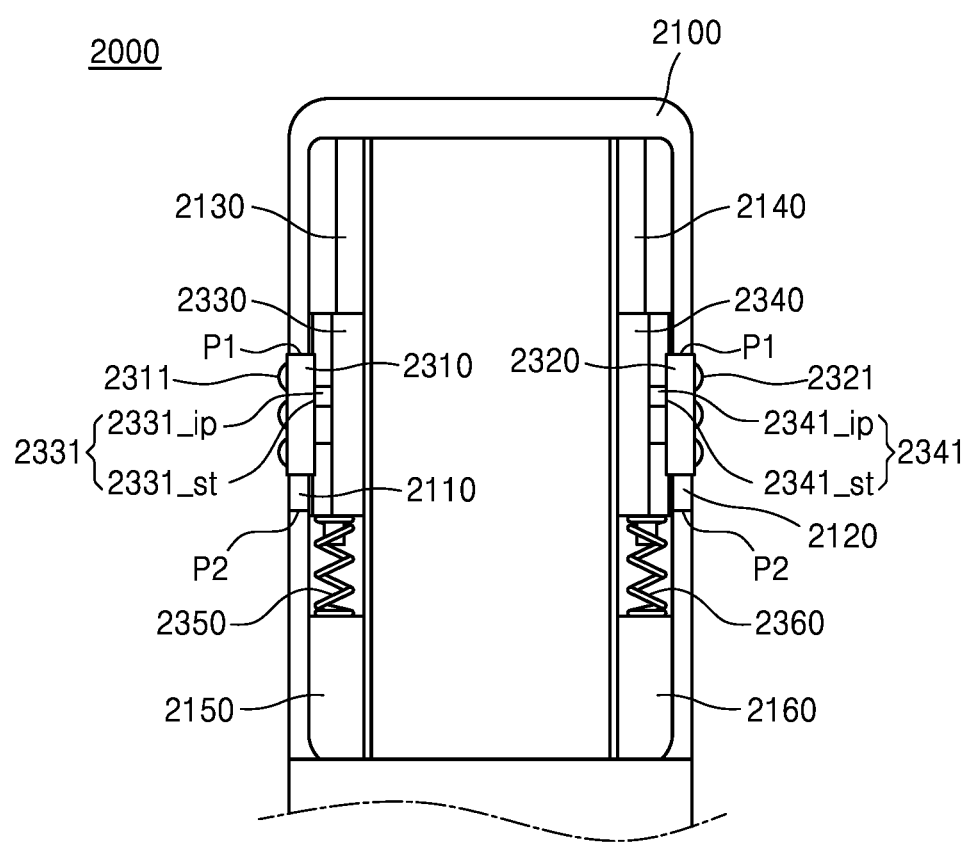
FIG. 10A is a front view illustrating a state in which a detachment manipulation unit of the aerosol-generating device shown in FIG. 9 is in a first operating state.
Figure 10B:
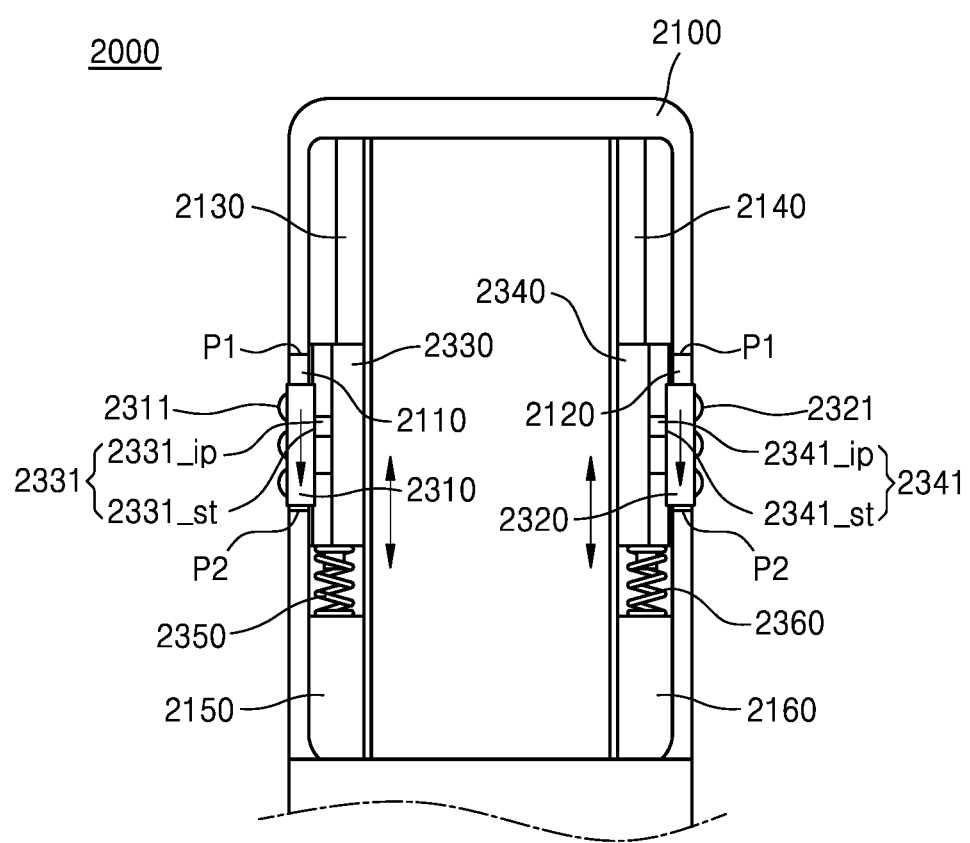
FIG. 10B is a front view illustrating a state in which the detachment manipulation unit of the aerosol-generating device shown in FIG. 9 is in a second operating state.

FIG. 10A is an exploded front view illustrating a state in which the detachment manipulation unit of the aerosol-generating device 2000 shown in FIG. 9 is in a first operating state, and FIG. 10B is an exploded front view illustrating a state in which the detachment manipulation unit of the aerosol-generating device 2000 shown in FIG. 9 is in a second operating state.

Referring to FIGS. 10A and 10B, the detachment manipulation unit 2300 includes a first button member 2310, which is exposed to outside through one side of the case 2100 so as to be manipulable by the user and is slidable in the vertical direction according to the user's manipulation, and a second button member 2320, which is exposed to outside through the other side of the case 2100 so as to be manipulable by the user and is slidable in the vertical direction according to the user's manipulation. User handles 2311 and 2321 protruding to allow the user to easily slide the first button member 2310 and the second button member 2320 may be formed on the surfaces of the first button member 2310 and the second button member 2320.

In addition, the detachment manipulation unit 2300 includes a first sliding member 2330 connected to the first button member 2310 and installed to be slidable in the vertical direction on one side of the case 1100, and a second sliding member 2340 connected to the second button member 2320 and installed to be slidable in the vertical direction on the other side of the case 2100.

In addition, the detachment manipulation unit 2300 may include a first elastic member 2350 elastically pressing the first sliding member 2330 in the vertical direction, and a second elastic member 2360 elastically pressing the second sliding member 2340 in the vertical direction.

The case 2100 includes a first sliding groove 2110 and a second sliding groove 2120. The first sliding groove 2110 accommodates the first button member 2310 sliding in the vertical direction and defines an upper threshold position P1 and a lower threshold position P2 between which the first button member 2310 may slide. The second sliding groove 2120 accommodates the second button member 2320 sliding in the vertical direction and defines an upper threshold position P1 and a lower threshold position P2 between which the second button member 2320 may slide.

In addition, the case 2100 includes a first rail member 2130 extending in the vertical direction and providing a space for the first sliding member 2330 to slide, and a second rail member 2140 extending in the vertical direction and providing a space for the second sliding member 2340 to slide. The case 2100 may further include base units 2150 and 2160 that support the first elastic member 2350 and the second elastic member 2360.

In FIGS. 10A and 10B, the base unit 2150 supporting the first elastic member 2350 and the base unit 2160 supporting the second elastic member 2360 are illustrated separately, but are not limited thereto. The base units 2150 and 2160 may be integrally formed so that one side may support the first elastic member 2350 and the other side may support the second elastic member 2360.

In addition, the first sliding member 2330 may include a first fastening protrusion 2331 protruding toward the vaporizer 2200, and the second sliding member 2340 may include a second fastening protrusion 2341 protruding toward the vaporizer 2200. The vaporizer 2200 may include a first fastening groove (not shown) accommodating the first fastening protrusion 2331 and a second fastening groove (not shown) accommodating the second fastening protrusion 2341.

Specifically, the first fastening protrusion 2331 includes a first stopper 2331_st that protrudes upwards, and the second fastening protrusion 2341 includes a second stopper 2341_st that protrudes upwards. The first fastening groove is formed upward to accommodate the first stopper 2331_st when the first stopper 2331_st moves upward, and the second fastening groove is formed upward to accommodate the second stopper 2341_st when the second stopper 2341_st moves upward.

When the detachment manipulation unit 2300 is in the first operating state, the first stopper 2331_st is accommodated in the first fastening groove to limit the movement of the vaporizer 2200 in the horizontal direction. When the detachment manipulation unit 2300 is in the second operating state, the first stopper 2331_st moves downward to be separated from the first fastening groove and thus may allow the vaporizer 2200 to move in the horizontal direction.

In addition, when the detachment manipulation unit 2300 is in the first operating state, the second stopper 2341_st is accommodated in the second fastening groove to limit the movement of the vaporizer 2200 in the horizontal direction. When the detachment manipulation unit 2300 is in the second operating state, the second stopper 2341_st move downward to be separated from the second fastening groove and may allow the vaporizer 2200 to move in the horizontal direction.

The first stopper 2331_st and the second stopper 2341_st include inclined surfaces, and when the vaporizer 2200 is being installed in the case 2100, the vaporizer 2200 may contact the inclined surfaces and move the first stopper 2331_st and the second stopper 2341_st downward by sliding over the inclined surfaces.

A method of fastening and separating the case 2100 and the vaporizer 2200 by the up-and-down movements of the first fastening protrusion 2331 and the second fastening protrusion 2341 described above with reference to FIGS. 9 to 10B is substantially the same as a method of fastening and separating the case 1100 and the vaporizer 1200 by the structures of the fastening protrusion 1323 and the fastening groove 1210 described with reference to FIGS. 7 and 8. However, there is a difference in that the first fastening protrusion 2331 and the second fastening protrusion 2341 in FIGS. 9 to 10B slide in the vertical direction only when the user presses both the first button member 2310 and the second button member 2320.

That is, in the exemplary embodiment illustrated in FIGS. 7 and 8, when the user presses the button member 1311, all of the fastening protrusions 1323 arranged on both sides of the case 1100 slide in the vertical direction. However, in the exemplary embodiment illustrated in FIGS. 9 to 10B, in order to slide both the first fastening protrusion 2331 and the second fastening protrusion 2341 in the vertical direction, the user has to press both the first button member 2310 and the second button member 2320.

Except for this difference, an operation of inserting or separating the first and second fastening protrusions 2331 and 2341 shown in FIGS. 9 to 10B into or from the first and second fastening grooves is substantially the same as an operation of inserting or separating the fastening protrusion 1323 shown in FIGS. 7 and 8 into or from the fastening groove 1210, and thus, detailed description of the operation will be omitted.

Figure 11:
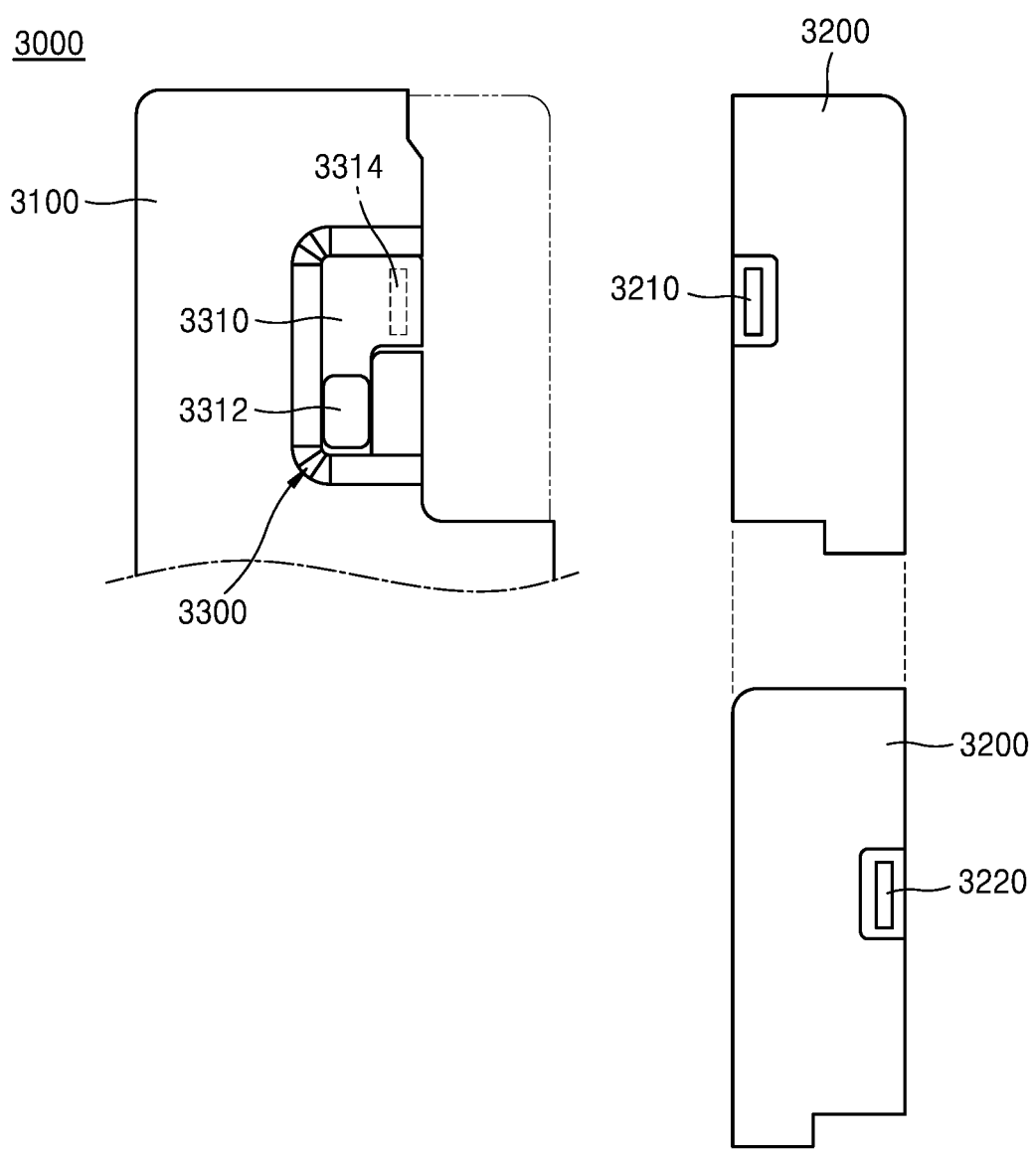
FIG. 11 is an exploded side view illustrating the appearance of an aerosol-generating device according to another exemplary embodiment of the present disclosure.
Figure 12:
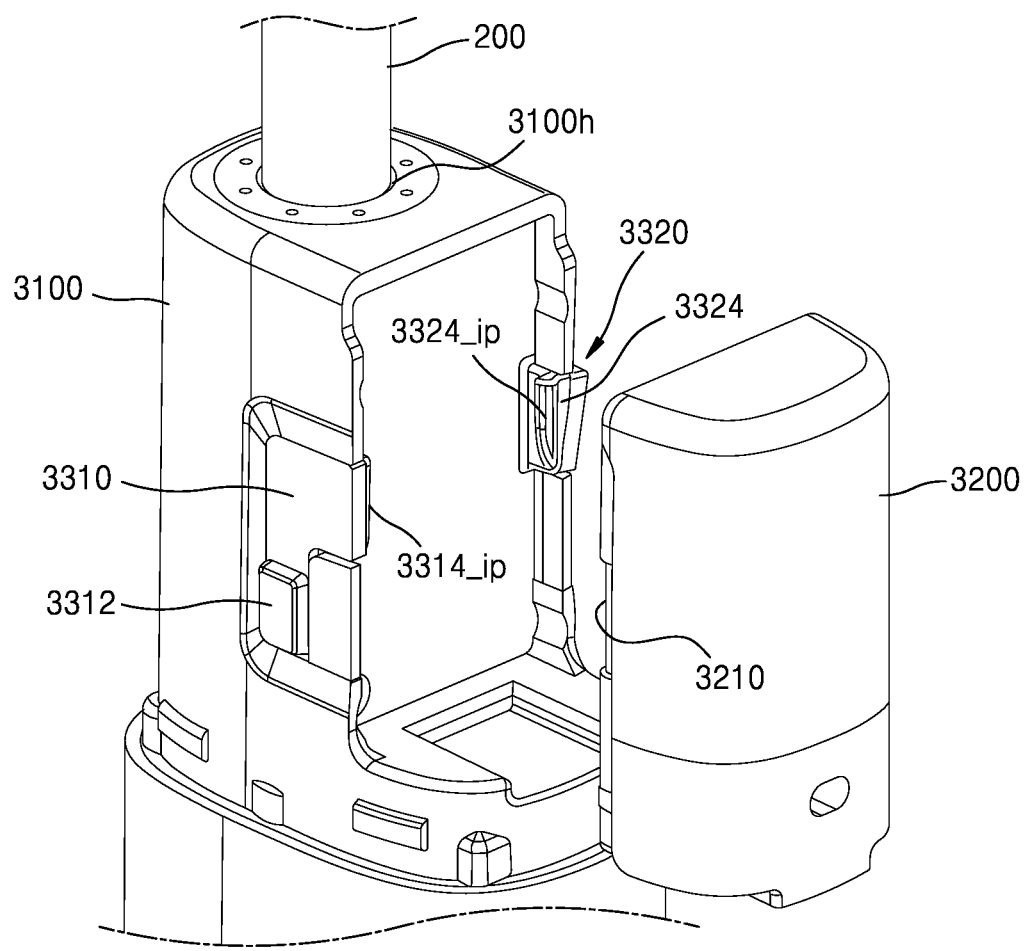
FIG. 12 is an exploded perspective view illustrating a state in which a vaporizer of the aerosol-generating device shown in FIG. 11 is separated from a case.

FIG. 11 is an exploded side view illustrating the exterior of an aerosol-generating device 3000 according to another exemplary embodiment of the present disclosure, and FIG. 12 is an exploded perspective view illustrating a state in which a vaporizer of the aerosol-generating device 3000 shown in FIG. 11 is separated from a case.

The aerosol-generating device 3000 shown in FIG. 11 may include a case 3100, a vaporizer 3200, and a detachment manipulation unit 3300. Since the descriptions of the case 3100 and the vaporizer 3200 are substantially the same as those of the cases 1100 and 2100 and the vaporizers 1200 and 2200, the following description will focus on structural features that are distinguished from the foregoing.

In the exemplary embodiment illustrated in FIGS. 11 and 12, a method of manipulating a button member 3312 of the detachment manipulation unit 3300 is the same as a method of manipulating the button member 1311 shown in FIG. 4. That is, the user may press the button member 3312 at the side thereof. However, a feature distinguished from that of the exemplary embodiment illustrated in FIG. 4 is that, in the case of the exemplary embodiment illustrated in FIG. 11, when the user presses the button member 3312, a first fastening protrusion 3314 does not move up and down but rotates about a first rotation shaft 3311 (see FIG. 13A) installed in the case 3100. According to the rotation, the first fastening protrusion 3314 may be inserted into a first fastening groove 3210 formed on the side of the vaporizer 3200, thereby fastening the vaporizer 3200 to the case 3100.

Hereinafter, the detachment manipulation unit 3230 will be described in detail with reference to FIGS. 13A and 13B.

Figure 13A:
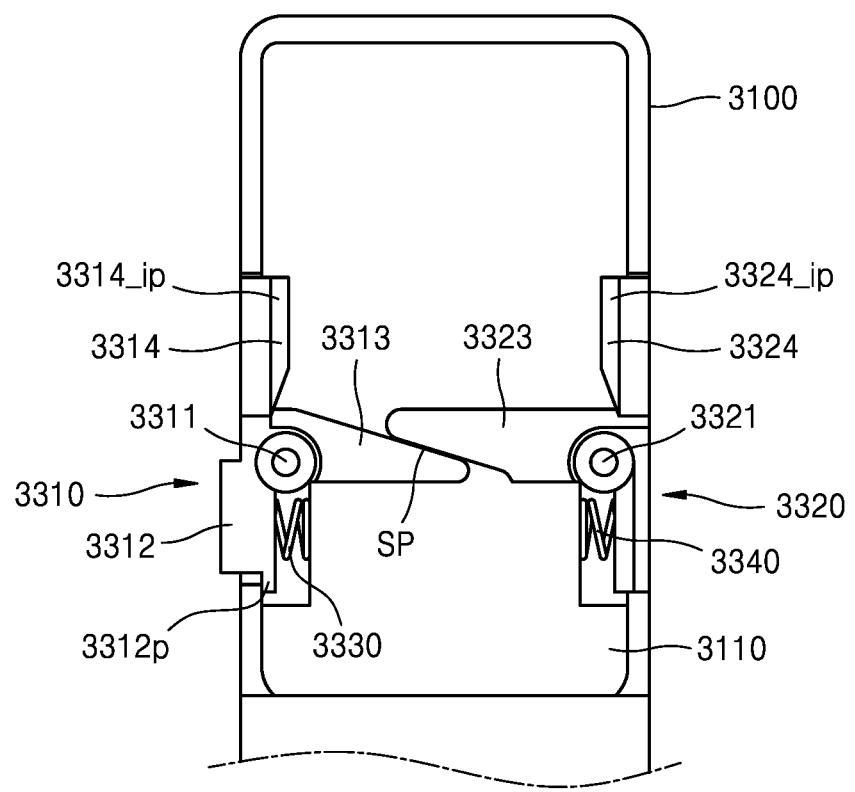
FIG. 13A is a front view illustrating a state in which a detachment manipulation unit of the aerosol-generating device shown in FIG. 11 is in a first operating state.
Figure 13B:
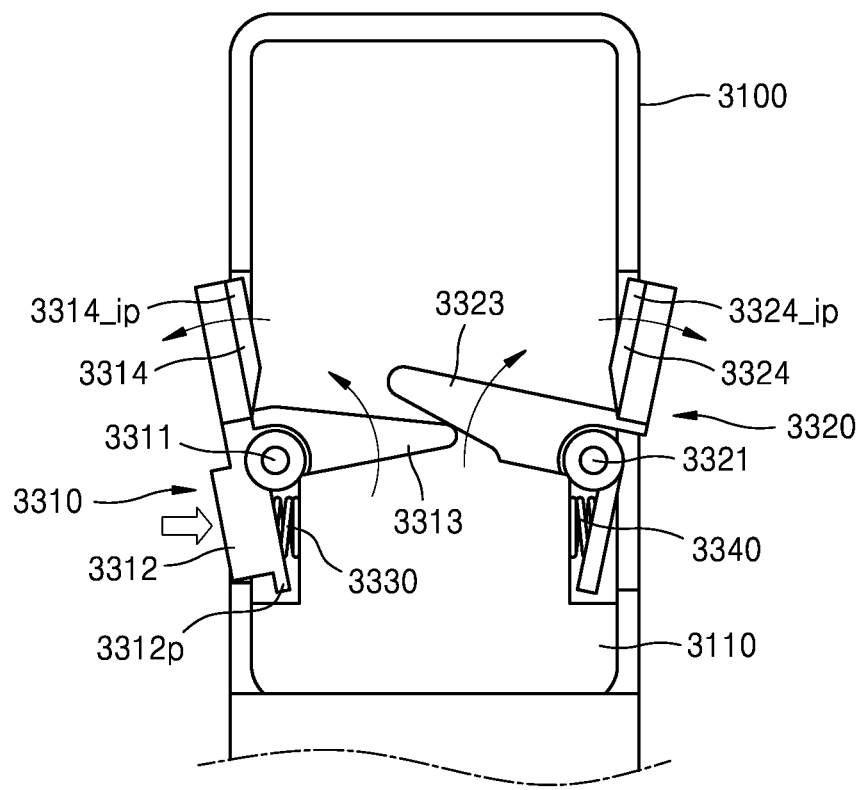
FIG. 13B is a front view illustrating a state in which the detachment manipulation unit of the aerosol-generating device shown in FIG. 11 is in a second operating state.

FIG. 13A is an exploded front view illustrating a state in which the detachment manipulation unit 3230 of the aerosol-generating device 3000 shown in FIG. 11 is in a first operating state, and FIG. 13B is an exploded front view illustrating a state in which the detachment manipulation unit 3230 of the aerosol-generating device 3000 shown in FIG. 11 is in a second operating state.

Referring to FIGS. 13A and 13B, the aerosol-generating device 3000 includes the detachment manipulation unit 3300. The detachment manipulation unit 3300 is installed in the case 3100 and performs, according to a user's manipulation, a first operation (see FIG. 13A) of maintaining a state in which the vaporizer 3200 is installed in the case 3100, and a second operation (see FIG. 13B) of allowing separation of the vaporizer 3200 from the case 3100.

Specifically, the detachment manipulation unit 3300 includes a first link member 3310 and a second link member 3320. The first link member 3310 is installed at one side of the case 3100 to be rotatable about a first rotation shaft 3311 extending from the case 3100 toward the vaporizer 3200. The second link member 3320 is installed at the other side of the case 3100 to be rotatable about a second rotation shaft 3321 extending from the case 3100 toward the vaporizer 3200. The second link member 3320 is engaged with the first link member 3310 and rotates with the first link member 3310 by the rotational movement of the first link member 3310.

The first link member 3310 includes a button member 3312 exposed to the outside through one side of the case 3100. The button member 3312 causes the first link member 3310 to rotate about the first rotation shaft 3311 according to a user's manipulation.

The first link member 3310 includes a first protruding member 3313 extending in a direction toward the second link member 3320, and the second link member 3320 includes a second protruding member 3323 extending in a direction toward the first link member 3310 and contacting the first protruding member 3313. When the user presses the button member 3312, the first protruding member 3313 may rotate about the first rotation shaft 3311, causing the second protruding member 3323 to rotate.

Although a surface where the first protruding member 3313 and the second protruding member 3323 contact each other is illustrated as an inclined surface SP, the exemplary embodiment is not limited thereto. The inclined surface SP is only a structure for more effectively engaging the first protruding member 3313 with the second protruding member 3323, but the exemplary embodiment is not limited thereto. For example, a surface where the first protruding member 3313 and the second protruding member 3323 are engaged with each other may be close to the horizontal direction.

The detachment manipulation unit 3300 includes a first elastic member 3330 and a second elastic member 3340. The first elastic member 3330 elastically presses the first link member 3310 such that the position of the detachment manipulation unit 3300 is restored from a position when the detachment manipulation unit 3300 is in a second operating state (see FIG. 13B) to a position when the detachment manipulation unit 3300 is in a first operating state (see FIG. 13A). The second elastic member 3340 elastically presses the second link member 3320. The case 3100 includes a base unit 3110 supporting the first elastic member 3330 and the second elastic member 3340.

That is, as shown in FIG. 13B, when the user presses the button member 3312, the first elastic member 3330 is compressed, and with the restoring force thereof, the first elastic member 3330 may elastically press the button member 3312. Accordingly, the first link member 3310 may receive force in a clockwise direction about the first rotation shaft 3311 as a whole. In other words, the first link member 3310 may receive force by which the state of the detachment manipulation unit 3300 shown in FIG. 13A is restored to the first operating state.

Similarly, when the user presses the button member 3312, the second elastic member 3340 is also compressed, and with the restoring force thereof, the second elastic member 3340 may elastically press the second link member 3320. Accordingly, the second link member 3320 may receive force in a counterclockwise direction about the second rotation shaft 3321 as a whole. In other words, the second link member 3320 may receive force by which the state of the detachment manipulation unit 3300 shown in FIG. 13A is restored to the first operating state.

Specifically, the button member 3312 includes a locking jaw 3312p that extends along the inner wall of the case 3100 and limits the rotation of the first link member 3310 by being engaged with the inner wall of the case 3100 when the detachment manipulation unit 3300 is in the first operating state. That is, as shown in FIG. 13A, when the button member 3312 receives force that causes the first link member 3310 to rotate in a clockwise direction about the first rotation shaft 3311 by the first elastic member 3330, the first operating state illustrated in FIG. 13A may be maintained because the locking jaw 3312p is engaged with the inner wall of the case 3100 to limit further rotation of the first link member 3310.

The first link member 3310 includes a first fastening protrusion 3314 protruding toward the second link member 3320, and the second link member 3320 includes a second fastening protrusion 3324 protruding toward the first link member 3310.

As shown in FIGS. 10 and 11, the vaporizer 3200 includes a first fastening groove 3210 formed at one side to accommodate the first fastening protrusion 3314, and a second fastening groove 3220 formed at the other side to accommodate the second fastening protrusion 3324.

When the detachment manipulation unit 3300 is in the first operating state (see FIG. 13A), the first fastening protrusion 3314 and the second fastening protrusion 3324 are respectively accommodated in the first fastening groove 3210 and the second fastening groove 3220 to limit the movement of the vaporizer 3200 in the horizontal direction. When the detachment manipulation unit 3300 is in the second operating state (see FIG. 13B), the first fastening protrusion 3314 and the second fastening protrusion 3324 may be separated from the first fastening groove 3210 and the second fastening groove 3220 by rotating about the first rotation shaft 3311 and the second rotation shaft 3321, respectively, and thus may allow the vaporizer 3200 to move in the horizontal direction.

In addition, the first fastening protrusion 3314 and the second fastening protrusion 3324 include an inclined surface 3314_ip and an inclined surface 3324_ip, respectively. When the vaporizer 3200 is being installed in the case 3100, the vaporizer 3200 may move the first fastening protrusion 3314 and the second fastening protrusion 3324, in a direction toward a position when the detachment manipulation unit 3300 is in the second operating state, by sliding over the inclined surfaces 3314_ip and 3324_ip.

That is, the vaporizer 3200 contacts the inclined surface 3314_ip of the first fastening protrusion 3314 and the inclined surface 3324_ip of the second fastening protrusion 3324. The vaporizer 3200 slides over the inclined surface 3314_ip of the first fastening protrusion 3314 and the inclined surface 3324_ip of the second fastening protrusion 3324, causing the first fastening protrusion 3314 to rotate counterclockwise about the first rotation shaft 3311 and causing the second fastening protrusion 3324 to rotate clockwise about the second rotation shaft 3321.

In this state, when the vaporizer 3200 is continuously pushed toward the case 3100, the first fastening protrusion 3314 may be fitted into the first fastening groove 3210 and the second fastening protrusion 3324 may be fitted into the second fastening groove 3220, and thus, the vaporizer 3200 may be installed in the case 3100.

Figure 14:
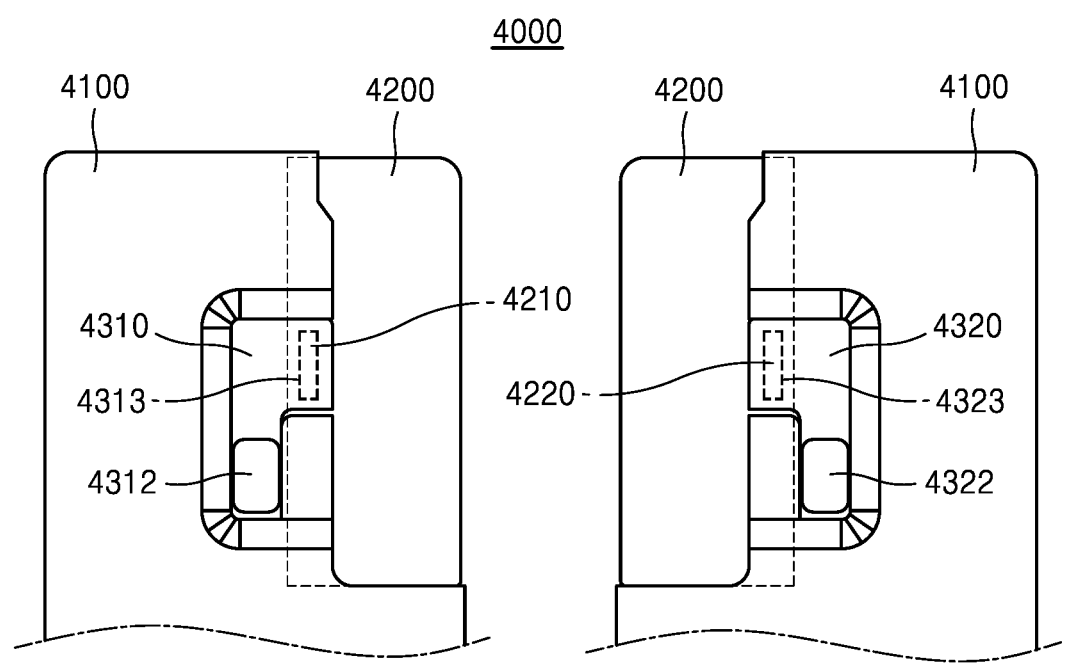
FIG. 14 is a side view illustrating the appearance of an aerosol-generating device according to another exemplary embodiment of the present disclosure.

FIG. 14 is a side view illustrating the exterior of an aerosol-generating device 4000 according to another exemplary embodiment of the present disclosure.

The aerosol-generating device 4000 shown in FIG. 14 may include a case 4100, a vaporizer 4200, and a detachment manipulation unit 4300. Since the descriptions of the case 4100 and the vaporizer 4200 are substantially the same as those of the cases 1100, 2100, and 3100 and the vaporizers 1200, 2200, and 3200 the following description will focus on structural features that are distinguished from the foregoing.

In the exemplary embodiment illustrated in FIG. 14, a method of manipulating a first button member 4312 and a second button member 4322 of the detachment manipulation unit 4300 is the same as a method of manipulating the button member 3312 shown in FIG. 11. That is, the user may press the first button member 4312 and the second button member 4322 at the sides thereof, respectively. However, a feature distinguished from that of the exemplary embodiment illustrated in FIG. 11 is that, in the case of the exemplary embodiment illustrated in FIG. 14, the user has to simultaneously press the first button member 4312 and the second button member 4422.

Hereinafter, the detachment manipulation unit 4300 will be described in detail with reference to FIGS. 15A and 15B.

Figure 15A:
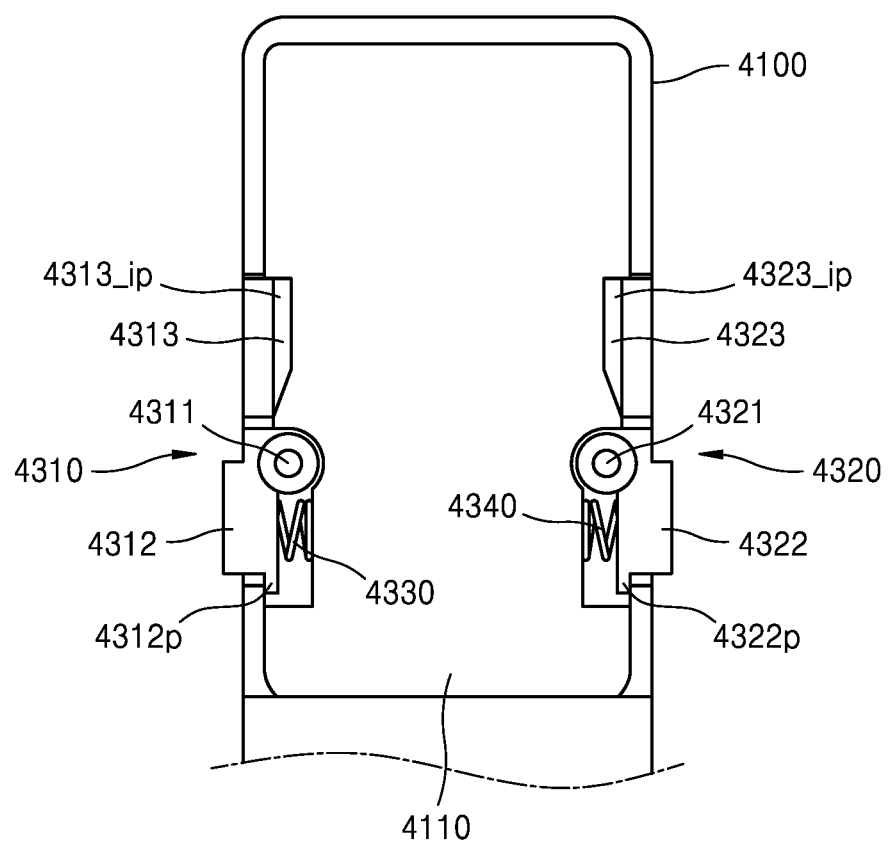
FIG. 15A is a front view illustrating a state in which a detachment manipulation unit of the aerosol-generating device shown in FIG. 14 is in a first operating state.
Figure 15B:
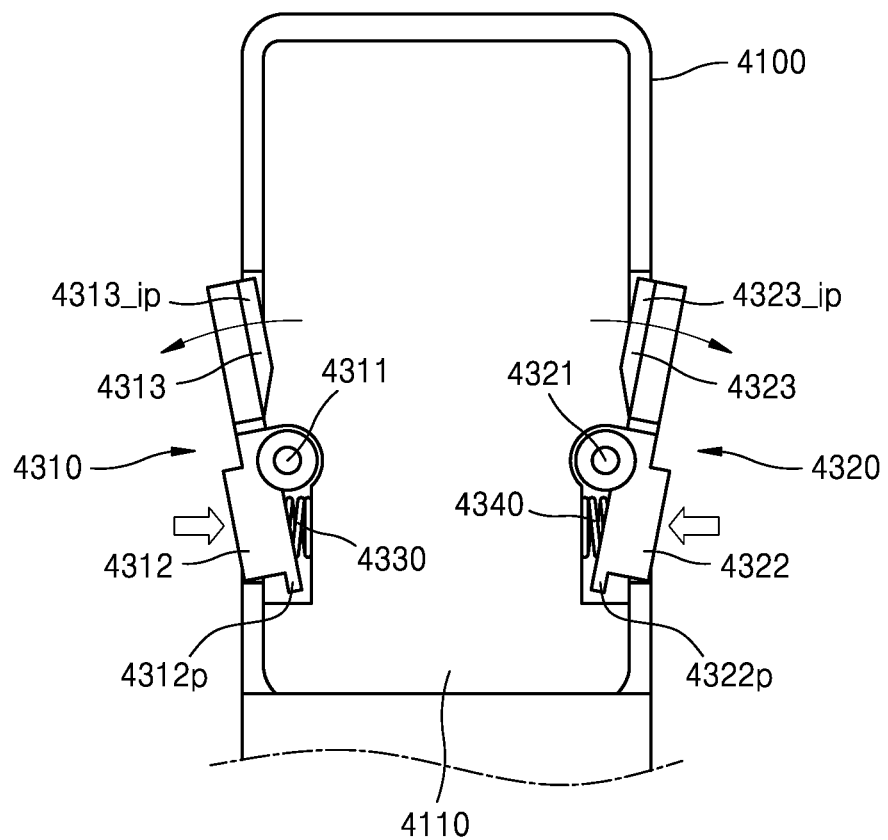
FIG. 15B is a front view illustrating a state in which the detachment manipulation unit of the aerosol-generating device shown in FIG. 14 is in a second operating state.

FIG. 15A is an exploded front view illustrating a state in which the detachment manipulation unit 4300 of the aerosol-generating device 4000 shown in FIG. 14 is in a first operating state, and FIG. 15B is an exploded front view illustrating a state in which the detachment manipulation unit 4300 of the aerosol-generating device 4000 shown in FIG. 14 is in a second operating state.

Referring to FIGS. 15A and 15B, the aerosol-generating device 4000 includes the detachment manipulation unit 4300. The detachment manipulation unit 4300 is installed in the case 4100 and performs, according to a user's manipulation, a first operation (see FIG. 15A) of maintaining a state in which the vaporizer 4200 is installed in the case 4100, and a second operation (see FIG. 15B) of allowing separation of the vaporizer 4200 from the case 4100.

Specifically, the detachment manipulation unit 4300 includes a first link member 4310 and a second link member 4320. The first link member 4310 is installed at one side of the case 4100 to be rotatable about a first rotation shaft 4311 extending from the case 4100 toward the vaporizer 4200. The second link member 4320 is installed at the other side of the case 4100 to be rotatable about a second rotation shaft 4321 extending from the case 4100 toward the vaporizer 4200.

The first link member 4310 includes a first button member 4312 exposed to the outside through one side of the case 4100. The first button member 4312 causes the first link member 4310 to rotate about the first rotation shaft 4311 according to a user's manipulation.

The second link member 4320 includes a second button member 4322 exposed to the outside of the other side of the case 4100. The second button member 4322 causes the second link member 4320 to rotate about the second rotation shaft 4321 according to a user's manipulation.

In addition, the detachment manipulation unit 4300 includes a first elastic member 4330 and a second elastic member 4340. The first elastic member 4330 elastically presses the first link member 4310 in a direction in which the position of the detachment manipulation unit 4300 is restored from a position when the detachment manipulation unit 4300 is in the second operating state (see FIG. 15B) to a position when the detachment manipulation unit 4300 is in the first operating state (see FIG. 15A). The second elastic member 4340 elastically presses the second link member 4320. The case 4100 includes a base unit 4110 supporting the first elastic member 4330 and the second elastic member 4340.

That is, as shown in FIG. 15B, when the user presses the first button member 4312, the first elastic member 4330 is compressed, and with the restoring force thereof, the first elastic member 4330 may elastically press the first button member 4312. Accordingly, the first link member 4310 may receive force in a clockwise direction about the first rotation shaft 4311 as a whole. In other words, the first link member 4310 may receive force by which the state of the detachment manipulation unit 4300 shown in FIG. 15A is restored to the first operating state.

Similarly, when the user presses the second button member 4322, the second elastic member 4340 is compressed, and with the restoring force thereof, the second elastic member 4340 may receive force in a counterclockwise direction about the second rotation shaft 4321 as a whole. In other words, the second elastic member 4340 may receive force by which the state of the detachment manipulation unit 4300 shown in FIG. 15A is restored to the first operating state.

Specifically, the first button member 4312 includes a first locking jaw 4312*p* that extends along the inner wall of the case 4100 and limits the rotation of the first link member 4310 by being engaged with the inner wall of the case 4100 when the detachment manipulation unit 4300 is in the first operating state. That is, as shown in FIG. 15A, when the first button member 4312 receives force that causes the first link member 4310 to rotate in a clockwise direction about the first rotation shaft 4311 by the first elastic member 4330, the first operating state illustrated in FIG. 15A may be maintained because the locking jaw 4312*p* is engaged with the inner wall of the case 4100 to limit further rotation of the first link member 4310.

In addition, the second button member 4322 includes a second locking jaw 4322*p* that extends along the inner wall of the case 4100 and limits the rotation of the second link member 4320 by being engaged with the inner wall of the case 4100 when the detachment manipulation unit 4300 is in the first operating state. That is, as shown in FIG. 15A, when the second button member 4322 receives force that causes the second button member 4322 to rotate in a counterclockwise direction about the second rotation shaft 4321 by the second elastic member 4340, the first operating state illustrated in FIG. 15A may be maintained because the locking jaw 4322*p* is engaged with the inner wall of the case 4100 to limit further rotation of the second link member 4320.

The first link member 4310 includes a first fastening protrusion 4313 protruding toward the second link member 4320, and the second link member 4320 includes a second fastening protrusion 4323 protruding toward the first link member 4310.

As shown in FIG. 14, the vaporizer 4200 includes a first fastening groove 4210 formed at one side to accommodate the first fastening protrusion 4313, and a second fastening groove 4220 formed at the other side to accommodate the second fastening protrusion 4323.

When the detachment manipulation unit 4300 is in the first operating state (see FIG. 15A), the first fastening protrusion 4313 and the second fastening protrusion 4323 are respectively accommodated in the first fastening groove 4210 and the second fastening groove 4220 to limit the movement of the vaporizer 4200 in the horizontal direction. When the detachment manipulation unit 4300 is in the second operating state (see FIG. 15B), the first fastening protrusion 4313 and the second fastening protrusion 4323 may be separated from the first fastening groove 4210 and the second fastening groove 4220 by rotating about the first rotation shaft 4311 and the second rotation shaft 4321, respectively, and thus may allow the vaporizer 4200 to move in the horizontal direction.

In addition, the first fastening protrusion 4313 and the second fastening protrusion 4323 include an inclined surface 4313_*ip* and an inclined surface 4323_*ip*, respectively. When the vaporizer 4200 is being installed in the case 4100, the vaporizer 4200 may move the first fastening protrusion 4313 and the second fastening protrusion 4323, in a direction toward a position when the detachment manipulation unit 4300 is in the second operating state, by sliding over the inclined surfaces 4313_*ip* and 4323_*ip*.

That is, the vaporizer 4200 contacts the inclined surface 4313_*ip* of the first fastening protrusion 4313 and the inclined surface 4323_*ip* of the second fastening protrusion 4323, and the vaporizer 4200 slides over the inclined surface 4313_*ip* of the first fastening protrusion 4313 and the inclined surface 4323_*ip* of the second fastening protrusion 4323. Thus, the first fastening protrusion 4313 may rotate counterclockwise about the first rotation shaft 4311 and the second fastening protrusion 4323 may rotate clockwise about the second rotation shaft 4321.

In this state, when the vaporizer 4200 is continuously pushed toward the case 4100, the first fastening protrusion 4313 may be fitted into the first fastening groove 4210 and the second fastening protrusion 4323 may be fitted into the second fastening groove 4220, and thus, the vaporizer 4200 may be installed in the case 4100.

According to the aerosol-generating devices 1000, 2000, 3000, and 4000 according to the exemplary embodiments of the present disclosure, the vaporizers 1200, 2200, 3200, and 4200 may be easily attached to and detached from the cases 1100, 2100, 3100 and 4100 through a simple button manipulation.

While the disclosure has been particularly shown and described with reference to exemplary embodiments thereof, it will be understood by those of ordinary skill in the art that various changes in form and detail may be made therein without departing from the spirit and scope of the disclosure as defined by the following claims. Thus, the exemplary embodiments should be considered in a descriptive sense only and not for purposes of limitation. Therefore, the scope of the disclosure is defined not by the detailed description of the disclosure but by the appended claims, and all differences within the scope will be construed as being included in the disclosure.

The invention claimed is:

1. An aerosol-generating device comprising:
a case including a cigarette insertion hole configured to receive a cigarette;
a vaporizer configured to be combined with and detached from the case independently of the cigarette, and configured to provide an aerosol to the cigarette inserted in the cigarette insertion hole; and
a detachment manipulation unit installed in the case and configured to perform, according to user manipulation, a first operation of maintaining a state in which the vaporizer is combined with the case and a second operation of allowing separation of the vaporizer from the case.

2. The aerosol-generating device of claim 1, wherein the detachment manipulation unit comprises:
a first link member slidable in a horizontal direction according to user manipulation; and
a second link member engaged with the first link member and slidable in a vertical direction by a sliding motion of the first link member, and
wherein the first link member comprises a button member which is exposed to outside of the case and causes the first link member to slide in the horizontal direction according to user manipulation.

3. The aerosol-generating device of claim 2, wherein the second link member comprises a protruding member protruding toward the first link member,
the first link member further comprises an accommodating groove that accommodates the protruding member, and
a portion where the protruding member and the accommodating groove contact each other is an inclined surface.

4. The aerosol-generating device of claim 2, wherein the detachment manipulation unit further comprises an elastic member that elastically presses the second link member to have resilient force in a direction toward the first link member.

5. The aerosol-generating device of claim 4, wherein the case comprises a base unit that supports the elastic member.

6. The aerosol-generating device of claim 2, wherein the first link member further comprises a first rail member extending in the horizontal direction, and
the second link member further comprises a second rail member extending in the vertical direction,
wherein the case comprises:
a first guide member accommodated in the first rail member; and
a second guide member accommodated in the second rail member,
wherein the first rail member moves along the first guide member as the first link member slides in the horizontal direction, and
wherein the second rail member moves along the second guide member as the second link member slides in the vertical direction.

7. The aerosol-generating device of claim 6, wherein the first rail member and the second rail member are formed as stepped grooves in surfaces of the first link member and the second link member or as throughholes passing through the first link member and the second link member, to accommodate the first guide member and the second guide member, respectively.

8. The aerosol-generating device of claim 6, wherein when the detachment manipulation unit is in the first operating state, the first guide member is engaged with one end of the first rail member to limit sliding in a direction in which the first link member is separated from the case.

9. The aerosol-generating device of claim 6, wherein when the detachment manipulation unit is in the second operating state, the first guide member is engaged with the other end of the first rail member to limit sliding in a direction in which the first link member is inserted into the case.

10. The aerosol-generating device of claim 6, wherein when the detachment manipulation unit is in the first operating state, the second guide member is engaged with one end of the second rail member to limit sliding of the second link member in a direction toward the first link member.

11. The aerosol-generating device of claim 6, wherein when the detachment manipulation unit is in the second operating state, the second guide member is engaged with the other end of the second rail member to limit sliding of the second link member in an opposite direction of the first link member.

12. The aerosol-generating device of claim 2, wherein the second link member comprises a fastening protrusion protruding toward the vaporizer, and
the vaporizer comprises a fastening groove that accommodates the fastening protrusion.

13. The aerosol-generating device of claim 12, wherein the fastening protrusion comprises a stopper protruding upward, and
the fastening groove is formed upward to accommodate the stopper when the stopper moves upward, and
wherein the stopper
is accommodated in the fastening groove when the detachment manipulation unit is in the first operating state, thereby limiting movement of the vaporizer in the horizontal direction, and
moves downward to be separated from the fastening groove when the detachment manipulation unit is in the second operating state, thereby allowing the vaporizer to move in the horizontal direction.

14. The aerosol-generating device of claim 13, wherein the stopper comprises an inclined surface, and
when the vaporizer is being combined with the case, the vaporizer contacts the inclined surface and moves the stopper downward by sliding over the inclined surface.

15. The aerosol-generating device of claim 12, wherein the case comprises a guide hole that exposes the fastening protrusion to the outside as the fastening protrusion penetrates the case, wherein the guide hole is formed to extend in the vertical direction such that the fastening protrusion is movable in the vertical direction along the guide hole.

* * * * *